(12) United States Patent
Kobayashi et al.

(10) Patent No.: US 7,075,139 B2
(45) Date of Patent: *Jul. 11, 2006

(54) METHOD OF MANUFACTURING SEMICONDUCTOR DEVICE

(75) Inventors: Takashi Kobayashi, Tokorozawa (JP); Atsuko Katayama, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/872,501

(22) Filed: Jun. 22, 2004

(65) Prior Publication Data

US 2004/0229476 A1   Nov. 18, 2004

Related U.S. Application Data

(60) Continuation of application No. 10/376,694, filed on Mar. 3, 2003, now Pat. No. 6,764,902, which is a division of application No. 09/931,891, filed on Aug. 20, 2001, now Pat. No. 6,596,585, which is a division of application No. 08/993,094, filed on Dec. 18, 1997, now Pat. No. 6,489,649.

(30) Foreign Application Priority Data

Dec. 26, 1996   (JP)   ................................. 8-347169

(51) Int. Cl.
  *H01L 29/76*   (2006.01)
  *H01L 29/788*   (2006.01)
(52) U.S. Cl. .................. 257/314; 257/315; 257/316; 438/257
(58) Field of Classification Search ............. 257/314, 257/315, 316; 438/257, 954
See application file for complete search history.

(56) References Cited

U.S. PATENT DOCUMENTS

| 5,381,028 A | 1/1995 | Iwasa |
| 5,464,792 A | 11/1995 | Tseng et al. |
| 5,521,127 A | 5/1996 | Hori |
| 5,557,122 A | 9/1996 | Shrivastava et al. |
| 5,661,056 A | 8/1997 | Takeuchi |
| 5,686,333 A | 11/1997 | Sato |
| 5,726,087 A | 3/1998 | Tseng et al. |

(Continued)

FOREIGN PATENT DOCUMENTS

JP          61248566          11/1986

(Continued)

OTHER PUBLICATIONS

Nakayama "AP+ Poly-Si Gate With Nitrogen-Doped Poly-Si Layer For Deep Submicron PMOSFETS", Pennington, NJ, USA; Electrochem. Soc., 1991, p. 9-16.

(Continued)

*Primary Examiner*—Alexander Ghyka
(74) *Attorney, Agent, or Firm*—Antonelli, Terry, Stout and Kraus, LLP.

(57) ABSTRACT

Described is a semiconductor device having a silicon oxide ($SiO_2$) film into which nitrogen atoms, in a range between approximately $2 \times 10^{20}$ atoms/cm$^3$ or more and $2 \times 10^{21}$ atoms/cm$^3$ or less, are introduced, used as an insulator film in the semiconductor device. For example, the device can be a nonvolatile memory device, and the silicon oxide film can be used as an insulator film between, e.g., a floating gate electrode and control gate electrode of the nonvolatile memory device. Stable operations and a retention capability of a nonvolatile memory device are obtained even if the nonvolatile memory device is scaled. Moreover, a programming voltage can be lowered. Also described are methods of fabricating the semiconductor device.

6 Claims, 17 Drawing Sheets

U.S. PATENT DOCUMENTS

| | | | |
|---|---|---|---|
| 5,739,573 A | 4/1998 | Kawaguchi | |
| 5,897,354 A | 4/1999 | Kachelmeier | |
| 5,939,763 A | 8/1999 | Hao et al. | |
| 6,077,758 A | 6/2000 | Zhang et al. | |
| 6,489,649 B1 * | 12/2002 | Kobayashi et al. | 257/314 |
| 6,596,585 B1 * | 7/2003 | Kobayashi et al. | 438/257 |

FOREIGN PATENT DOCUMENTS

| | | |
|---|---|---|
| JP | 4155969 | 5/1992 |
| JP | 04-199672 | 7/1992 |
| JP | 08-018059 | 1/1996 |
| JP | 08-153814 | 6/1996 |
| JP | 08-340056 | 12/1996 |
| JP | 8340056 | 12/1996 |

OTHER PUBLICATIONS

"Reduced Poly-Si TFT Threshold Voltage Instability by High-Temperature Hydrogenation of a-Si-Like Spin Centers", Kamigaki, et al., pp. 12-17.

"ONO Inter-Poly Dielectric Scaing for Nonvolatile Memory Applications", Mori, et al., vol. 38, No. 2, Feb. 1991.

"Electrical and Physical Characteristics of Thin Nitrided Oxides Prepared by Rapid Thermal Nitridation", Hori, et al., vol. ED-34, No. 11, Nov. 1987.

"Hydrogen in low-pressure chemical-vapor-deposited silicon (oxy)nitride films", Habraken, et al., J. Appl. Phys. 59(2), Jan. 15, 1986 pp. 447-453.

* cited by examiner

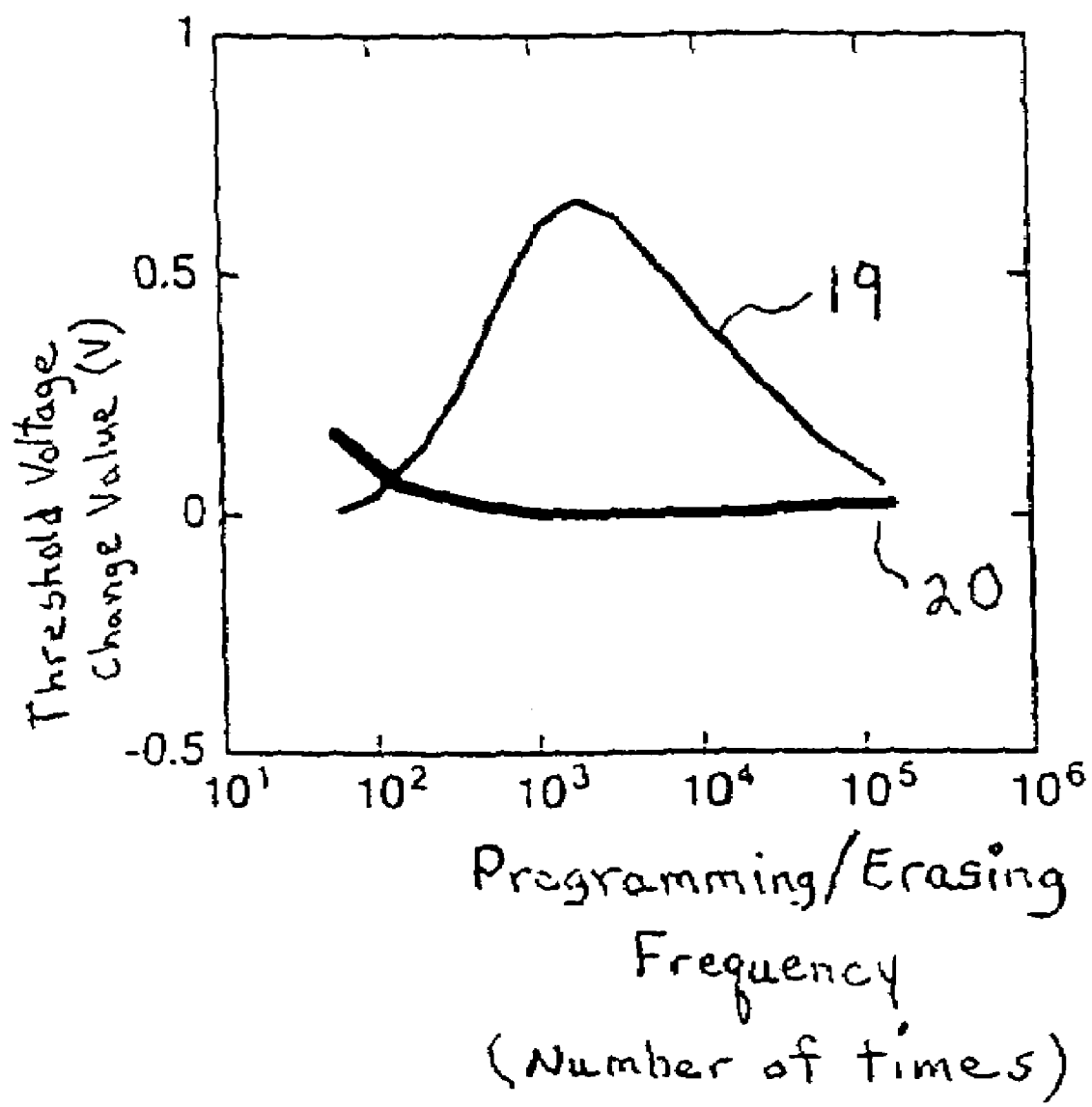

METHOD OF MANUFACTURING SEMICONDUCTOR DEVICE

This application is a Continuation application of application Ser. No. 10/376,694, filed Mar. 3, 2003 now U.S. Pat. No. 6,764,902, which is a Divisional application of application Ser. No. 09/931,891, filed Aug. 20, 2001, now U.S. Pat. No. 6,596,585, issued Jul. 22, 2003, which is a Divisional application of application Ser. No. 08/993,094, filed Dec. 18, 1997, now U.S. Pat. No. 6,489,649, issued Dec. 3, 2002, the contents of which are incorporated herein by reference in their entirety.

BACKGROUND OF THE INVENTION

The present invention relates to a semiconductor device, particularly to an art to be effectively applied to a semiconductor device comprising a nonvolatile memory device including an insulator film formed between a floating gate electrode and a control gate electrode. The present invention is especially directed to a nonvolatile memory (including, e.g., stacked type memories; or split type memories; or stacked type memories optionally having an erase gate in addition to the control and floating gates; or split type memories optionally having an erase gate in addition to the control and floating gates, with insulator films between the various gates), such as a flash memory.

A semiconductor device uses a nonvolatile memory device referred to as a flash memory. Because the flash memory is superior in portability and impact resistance and electrically allows on-board bulk erasing, it is anticipated as a file memory of a future compact portable data unit.

The flash memory is provided with a memory cell array section constituted by arranging a plurality of memory cells using a nonvolatile memory device as a memory unit like a matrix. The nonvolatile memory device is constituted on the surface of a semiconductor substrate made of, e.g., single crystalline silicon.

The above nonvolatile memory device mainly comprises a semiconductor substrate serving as a channel region, a first gate dielectric film, a floating gate electrode, a second gate dielectric film, a control gate electrode, and a pair of semiconductor regions serving as a source region and a drain region (also referred to as impurity diffusion layers). The nonvolatile memory device injects electrons into the floating gate electrode of the semiconductor substrate by applying a positive voltage to the control gate electrode of the semiconductor substrate, and stores one-bit data ("0" or "1") in accordance with the difference in the threshold voltages of memory cell transistors. Moreover, the first gate dielectric film denotes a tunnel dielectric film formed between the semiconductor substrate and the floating gate electrode. Furthermore, the second gate dielectric film denotes, e.g., an interpoly dielectric film formed between the floating gate electrode and the control gate electrode.

In the case of the nonvolatile memory device, the floating gate electrode and the control gate electrode are each respectively formed from a polycrystalline silicon film, and the first gate dielectric film and the second gate dielectric film are respectively formed from a silicon oxide ($SiO_2$) film. A silicon oxide film serving as the first gate dielectric film is formed by applying thermal oxidation to the surface of a semiconductor substrate made of single crystalline silicon, and a silicon oxide film serving as the second gate dielectric film is formed by applying thermal oxidation to the surface of a floating gate electrode made of a polycrystalline silicon film.

The silicon oxide film formed on the surface of the floating gate electrode made of the polycrystalline silicon film has a low breakdown voltage and is inferior in retention capability compared to a silicon oxide film formed on the surface of a semiconductor substrate made of single-crystal silicon. Therefore, in the case of flash memories of 4 [Mbit] onward, as the second gate dielectric film there is formed, in place of the single-layer silicon oxide film, a composite film, so-called an ONO (Oxide/Nitride/Oxide) film, obtained by superimposing a silicon oxide film, a silicon nitride ($Si_3N_4$) film, and a silicon oxide film in order on the floating gate electrode. This is because, when film thicknesses in terms of a silicon oxide film are the same, an ONO film has a small leakage current compared with a silicon oxide film. This art is discussed in "IEEE Transaction on Electron Devices, 38 (1991) pp. 386–391".

SUMMARY OF THE INVENTION

However, as the integration of a flash memory is improved, new problems occur when using an ONO film as the second gate dielectric film. One of the problems is that the process temperature following scaling of a nonvolatile memory device lowers. The ONO film is normally formed by thermally oxidizing the surface of a floating gate electrode made of a polycrystalline silicon film and thereby forming a lower silicon oxide film, then forming a silicon nitride film on the bottom silicon oxide film by a Low Pressure Chemical Vapor Deposition (LPCVD) process, and finally thermally oxidizing the surface of the silicon nitride film and thereby forming a top silicon oxide film. However, because oxidation of the silicon nitride film requires a high temperature of 900° C. or higher, it is difficult to form a shallow junction indispensable for scaling of an LSI (Large Scale Integrated Circuit), when forming a source region and a drain region and thereafter forming the second gate dielectric film, and this is a factor for interrupting improvement in the integration of a flash memory.

According to only the thermal oxidation process described above, it is possible to form a second gate dielectric film, of a single-layer silicon oxide film, even at a low temperature of approximately 800° C. However, this process has the problems that the thickness of a silicon oxide film decreases at the top end of the side wall of a floating gate electrode as the oxidation temperature is lowered, concentration of electric fields becomes remarkable at this portion, and leakage current increases. Moreover, an art is proposed in which a single-layer silicon oxide film is formed at a low temperature of approximately 750° C. by the LPCVD process, instead of the thermal oxidation process, to use the film as the second gate dielectric film of a nonvolatile memory device. By using the LPCVD process, it is possible to decrease the leakage current of a silicon oxide film compared to the case of using the thermal oxidation process. However, the effect of the LPCVD process is not enough and it is practically difficult to apply the process to a nonvolatile memory device.

Another problem is to decrease the thickness of the second gate dielectric film. A voltage Vfg to be applied to a floating gate electrode for the programming/erasing operation of a nonvolatile memory device is shown by the following expression (1).

[Numerical Formula 1]

$$Vfg = C_2 Vcg/(C_1+C_2) \qquad (1)$$

In the above expression, Vcg denotes a voltage applied to a control gate electrode, $C_1$ denotes the capacitance of a first gate dielectric film, and $C_2$ denotes the capacitance of a second gate dielectric film. To efficiently supply the voltage, applied to the control gate electrode, to the floating gate electrode and lower a programming voltage, it is effective to decrease the thickness of the second gate dielectric film and increase $C_2$. However, a conventional ONO film has a problem that electric charges accumulated in a floating gate electrode leak to a control gate electrode, that is, retention failure is actualized if thicknesses of top and bottom silicon oxide films are set to 5 nm or less. Moreover, to form the top silicon oxide film up to a thickness of 5 nm, it is necessary to form a silicon nitride film with a thickness of 10 nm or more in order to prevent the bottom polycrystalline silicon film, serving as a floating gate electrode, from oxidizing. Therefore, approximately 15 nm is a lower limit to the thickness of an ONO film in terms of a silicon oxide film. Because it is presently difficult to decrease the thickness of a first gate dielectric film, it is expected that a new second-gate-dielectric-film forming process is developed.

It is an object of the present invention to provide a semiconductor device (e.g., a nonvolatile memory device) having a gate dielectric film with a small leakage current at a low temperature, compared to a conventional ONO film, and having a stable operation and a sufficient retention capability even for smaller size (higher integration), and a method of manufacturing this semiconductor device.

It is another object of the present invention to provide a semiconductor device (e.g., a nonvolatile memory device, such as a flash memory) having two gate electrodes with an insulating film therebetween (e.g., floating and control gate electrodes; with an insulating film therebetween), wherein this insulating film has only a small leakage current, and a method of manufacturing this semiconductor device.

Moreover, it is another object of the present invention to provide an art making it possible to form a thin gate dielectric film compared to the case of using a conventional ONO film, and lower a programming voltage.

The above problems are solved by using a silicon oxide film or a composite film of a silicon oxide film and a silicon nitride film as a second gate dielectric film and introducing nitrogen into the silicon oxide film so that the maximum nitrogen atomic concentration in the silicon oxide film reaches approximately $2 \times 10^{20}$ atoms/cm$^3$ or higher. Moreover, it is more preferable that the maximum nitrogen atomic concentration in the silicon oxide film is approximately $2 \times 10^{21}$ atoms/cm$^3$ or less. Furthermore, by setting the maximum hydrogen atomic concentration in the silicon oxide film to $5 \times 10^{20}$ atoms/cm$^3$ or less, better advantage is obtained.

A semiconductor device of the present invention is characterized by having a silicon oxide film between a first silicon film (e.g., first polycrystalline silicon film) and a second silicon film (e.g., second polycrystalline silicon film) above the first silicon film, introducing nitrogen into the silicon oxide film, and keeping the maximum nitrogen atomic concentration in the silicon oxide film at approximately $2 \times 10^{20}$ atoms/cm$^3$ or higher, preferably approximately $2 \times 10^{21}$ atoms/cm$^3$ or lower. When the semiconductor device has a nonvolatile memory device, the first silicon film can correspond to a floating gate electrode, the silicon oxide film can correspond to a second gate dielectric film, and the second silicon film can correspond to a control gate electrode. In this case, n-type impurities such as phosphorus (P) are generally introduced into the first silicon film, and the second silicon film respectively. By using the silicon oxide film as the second gate dielectric film, it is possible to realize a film thickness of 15 nm or less which cannot be realized for a conventional ONO film.

The above silicon oxide film is formed, illustratively, by the LPCVD process using monosilane (SiH$_4$) and nitrogen monoxide (N$_2$O) as source gases. According to this process, it is possible to form a silicon oxide film at a low temperature of 700° C. to 800° C. As described above, however, it is difficult to use a silicon oxide film formed by the LPCVD process directly as the second gate dielectric film of a nonvolatile memory device. This is because the silicon oxide film has a large leakage current, and, when a power supply is cut off and the nonvolatile memory device is left as it is after injecting electrons into a floating gate electrode, electrons accumulated in the floating gate electrode leak to a control gate electrode and resultingly retention failure occurs. Moreover, because of a large leakage current, when injecting electrons into the floating gate electrode to boost the threshold of the nonvolatile memory device, problems also occur that the injected electrons go out to the control electrode side, the threshold voltage is not sufficiently boosted, and the writing and erasing threshold windows cannot be secured. As the result of our study, it is clarified that the leakage current of the silicon oxide film is caused by a defect referred to as an E' center present in the silicon oxide film.

The E' center is described in the article by Y. Kamigaki, et al., "Reduced Poly-Si TFT Threshold Voltage Instability By High-Temperature Hydrogenation of a-Si-Like Spin Centers", in the 33rd annual proceedings reliability physics 1995, pages 12–17, the contents of which are incorporated herein by reference in their entirety. Briefly, the E' center is $.Si \equiv O_3$; and this defect can be removed by annealing in the presence of nitrogen, whereby the nitrogen is incorporated in the structure to form N—Si$\equiv$O$_3$, to get rid of the E' center.

Therefore, in the case of the present invention, a leakage current is decreased by annealing a silicon oxide film in an NH$_3$ environment (e.g., atmosphere) and terminating an E' center at nitrogen atoms. The leakage current of the silicon oxide film is dependent on the nitrogen atomic concentration in the silicon oxide film. To decrease leakage current, control retention failure, and moreover secure a threshold voltage window, it is necessary to keep the maximum nitrogen atomic concentration in the silicon oxide film at approximately $2 \times 10^{20}$ atoms/cm$^3$ or higher, preferably at $2 \times 10^{21}$ atoms/cm$^3$ or lower. In this case, less nitrogen atoms are present in a middle region of the silicon oxide film than those in the top and bottom regions of the film. To obtain the above nitrogen atomic concentration, it is necessary to perform annealing in an NH$_3$ environment (e.g., atmosphere) in a temperature range of 750° C. to 900° C., preferably in a temperature range of 800° C. to 850° C. Therefore, it is possible to lower the temperature of the gate dielectric film forming process compared to the case of a conventional ONO film. Preferably, the annealing in a nitrogen-containing environment (e.g., an ammonia atmosphere) is at a maximum temperature of 900° C.; at such temperature in, e.g., the ammonia atmosphere, nitrogen can be incorporated in the silicon oxide film in a maximum amount of $2 \times 10^{21}$ atoms/cm$^3$. The preferred maximum nitrogen concentration takes into account the annealing temperature.

Moreover, by keeping the maximum hydrogen atomic concentration in the silicon oxide film at $5 \times 10^{20}$ atoms/cm$^3$ or lower, the present invention becomes more preferable. This is because hydrogen atoms present in the silicon oxide film form electron traps. When hydrogen atoms are present and a programming/erasing is performed, electrons are accumulated in a second gate dielectric film and the electrons accumulated in the gate dielectric film are discharged to a control gate electrode because of the subsequent leaving state and resultingly, retention failure occurs. To decrease the hydrogen atoms described above, it is necessary to perform wet oxidation for a short time at 800° C. to 900° C., preferably at 850° C.

Moreover, the present invention becomes preferable by controlling the nitrogen atomic concentration in a silicon oxide film so that the concentration becomes lower in the top region of the silicon oxide film (adjacent the control gate electrode) than in the bottom region of the film. This nitrogen atom distribution is achieved by performing the above wet oxidation.

The present invention is not restricted to semiconductor devices having a nonvolatile memory device. For example, an advantage can be also obtained by applying the present invention to a semiconductor device having an MOS (Metal Oxide Semiconductor) transistor using one of the above first silicon film and second silicon film as an active layer and the other of them as a gate electrode, and moreover, using the above silicon oxide film as a gate dielectric film (insulator film formed between the active layer and the gate electrode). The MOS transistor includes a load MOS transistor used for a memory cell of an SRAM (Static Random Access Memory) and a switching MOS transistor used for a liquid crystal display.

Furthermore, an advantage is obtained by applying the present invention to a semiconductor device having a capacitor using the first silicon film as a bottom electrode, the second silicon film as a top electrode, and the silicon oxide film as a dielectric film.

BRIEF DESCRIPTION OF THE DRAWINGS

FIG. 20 is an illustration of threshold voltage change values due to programming/erasing before and after reduction of hydrogen atoms by wet oxidation.

DESCRIPTION OF THE PREFERRED EMBODIMENTS

Embodiments of the present invention are described below in detail by referring to the accompanying drawings. These embodiments are illustrative of the present invention and not limiting thereof, the present invention being defined by the appended claims.

In every drawing for explaining the embodiments of the present invention, components having the same function are provided with the same symbol, and their repetitive description is omitted.

Embodiment 1

For this embodiment, a case is described in which the present invention is applied to an NOR-type flash memory as a semiconductor device having a nonvolatile memory device.

Figure 1:
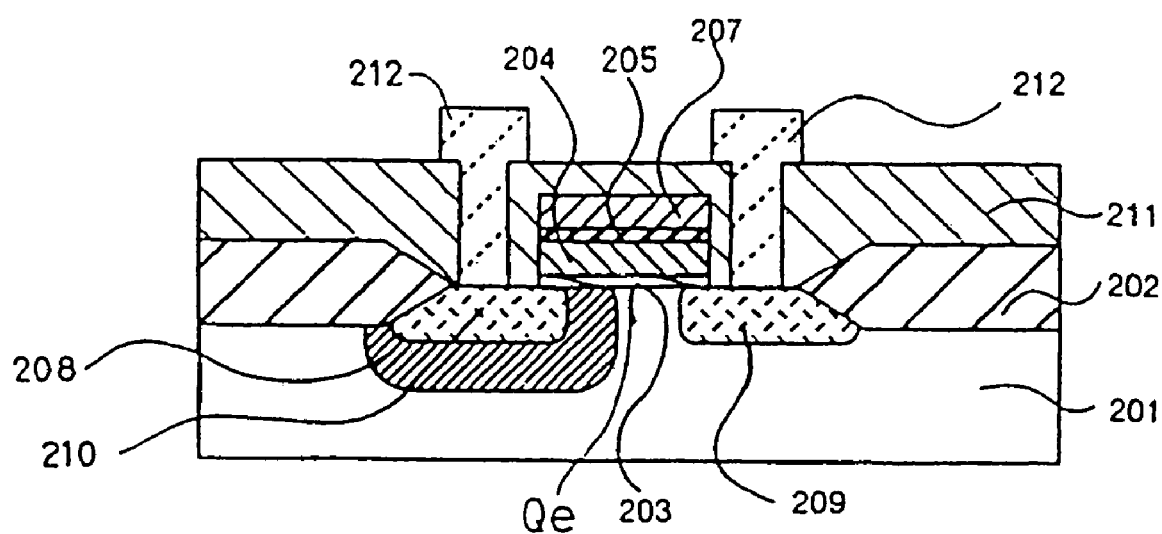
FIG. 1 is a cross-sectional view of a portion of the flash memory (semiconductor device) of the embodiment 1 of the present invention.

FIG. 1 is a cross-sectional view of a portion of an NOR-type flash memory.

The flash memory of this embodiment is provided with a memory cell array section in which a plurality of memory cells using the nonvolatile memory device Qe shown in FIG. 1 as one memory unit are arranged like a matrix.

The above flash memory mainly comprises a p-type semiconductor substrate 201 made of single-crystal silicon and having a surface orientation (100). A field insulator film 202 is formed in the inactive region of the surface of the p-type semiconductor substrate 201 and a nonvolatile memory device Qe is constituted in the active region of the surface of a p-type semiconductor substrate 201 whose periphery (e.g., circumference) is specified by the field insulator film 202.

The nonvolatile memory device Qe mainly comprises the p-type semiconductor substrate 201 used as a channel forming region, a first gate dielectric film 203, a floating gate electrode 204, a second gate dielectric film 205, a control gate electrode 207, a punch-through stopper region 208, a source region 209, and a drain region 210. In this case, the first gate dielectric film 203 represents a tunnel dielectric film formed between the p-type semiconductor substrate 201 and the floating gate electrode 204. Moreover, the second gate dielectric film 205 represents an interpoly dielectric film formed between the floating gate electrode 204 and the control gate electrode 207.

The first gate dielectric film 203 is made of a silicon oxide film formed by applying thermal oxidation to the surface of the p-type semiconductor substrate 201. The floating gate electrode 204 is made of a polycrystalline silicon film doped with n-type impurities in order to decrease the resistance value. The second gate dielectric film 205 is made of a silicon oxide film formed by the LPCVD process using $SiH_4$ and $N_2O$ as source gases. The silicon oxide film is doped with nitrogen in order to decrease leakage current. The control gate electrode 207 is made of a polycrystalline silicon film doped with n-type impurities in order to decrease the resistance value.

The punch-through stopper region 208 comprises a p-type semiconductor region containing p-type impurities introduced into the surface of the p-type semiconductor substrate 201. The source region 209 and the drain region 210 comprise a pair of n-type semiconductor regions containing n-type impurities introduced into the surface of the p-type semiconductor substrate 201.

An electrode 212 is electrically connected to the source region 209 through a contact hole formed through an interlayer dielectric film 211, and moreover, the electrode 212 is electrically connected to the drain region 210 through a contact hole formed through the interlayer dielectric film 211.

Then, a method for fabricating a memory cell using the nonvolatile memory device Qe as one memory unit is described below by referring to FIGS. 2(a)–2(c) and 3(a)–3(c) (cross-sectional views for explaining the fabrication method).

Figure 2A:
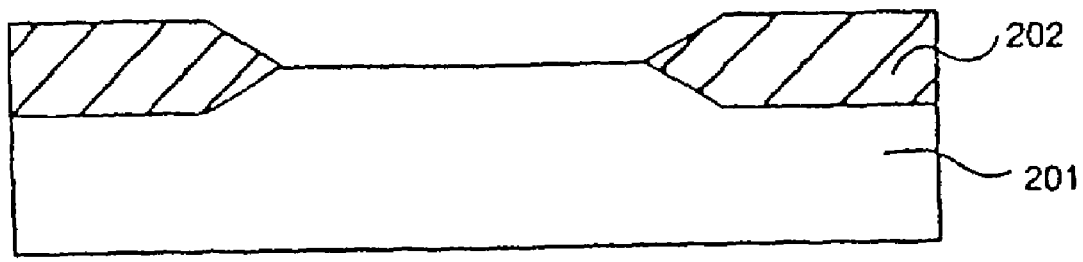
FIGS. 2(a) to 2(c) are cross-sectional views for explaining a method for fabricating the flash memory in FIG. 1.

First, the p-type semiconductor substrate 201 made of single-crystal silicon and having a surface orientation (100) is prepared. Then, the field insulator film 202 made of a silicon oxide film is formed in the inactive region of the surface of the 15 p-type semiconductor substrate 201 by the generally-known local oxidation. The field insulator film 202 is formed at a thickness of approximately 500 nm. FIG. 2(a) shows the process up to this step for this embodiment.

Then, thermal oxidation is applied to the active region of the surface of the p-type semiconductor substrate 201 to form the first gate dielectric film 203 made of a silicon oxide film. The first gate dielectric film 203 is formed at a thickness of approximately 10 nm.

Then, the polycrystalline silicon film 204 doped with n-type impurities (e.g. phosphorus) is formed on the entire surface of the p-type semiconductor substrate 201 including the surface of the first gate dielectric film 203. The polycrystalline silicon film 204 is formed at a thickness of approximately 200 nm.

Figure 2B:
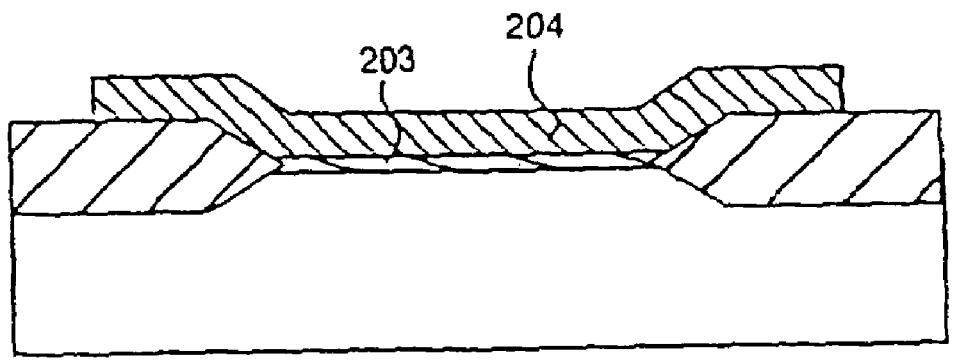

Then, patterning is applied to the polycrystalline silicon film 204. The patterning is performed by, e.g., standard photolithography and dry etching techniques. FIG. 2(b) shows the process up to this step.

Then, the silicon oxide film 205 is formed on the entire surface of the p-type semiconductor substrate 201 including the surface of the polycrystalline silicon film 204 at a thickness of, for example, 12 nm. The silicon oxide film 205 is formed by the LPCVD process using $SiH_4$ and $N_2O$ as source gases. In this case, the formation temperature is 750° C.

Figure 2C:
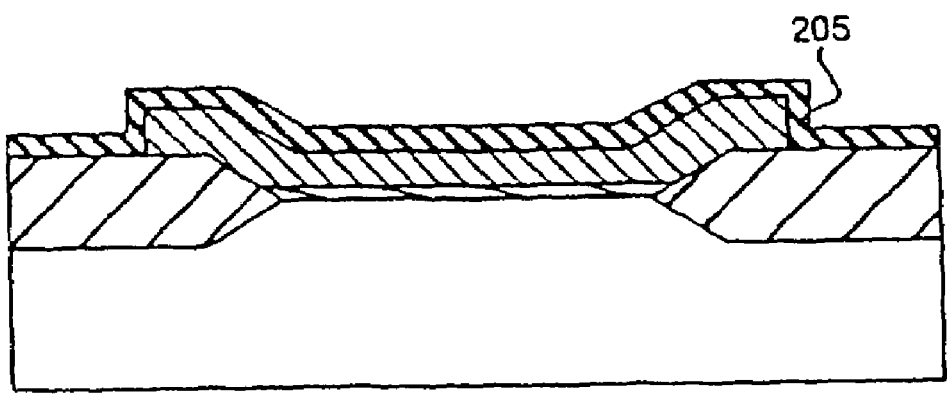

Then, annealing is performed in an $NH_3$ environment immediately after the above steps are completed to dope the silicon oxide film 205 with nitrogen. FIG. 2(c) shows the process up to this step.

Figure 3A:
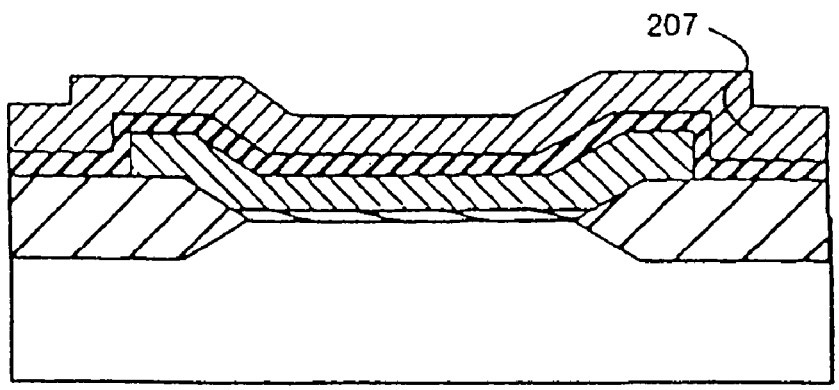
FIGS. 3(a) to 3(c) are cross-sectional views for explaining a method for fabricating the flash memory in FIG. 2.

Then, the polycrystalline silicon film 207 doped with n-type impurities (e.g. phosphorus) is formed on the entire surface of the silicon oxide film 205. The polycrystalline silicon film 207 is formed at a thickness of, for example, approximately 200 nm. FIG. 3(a) shows the process up to this step.

Figure 3B:
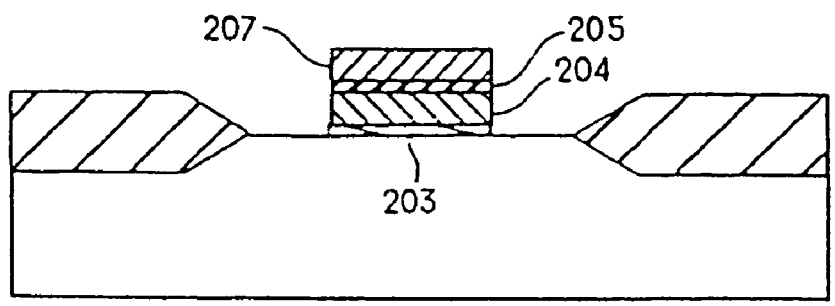

Then, patterning for specifying the width in the gate-length direction is applied to the polycrystalline silicon film 207, silicon oxide film 205, and polycrystalline silicon film 204, in order so as to form the control gate electrode 207 made of the polycrystalline silicon film 207 doped with n-type impurities, the second gate dielectric film 205 made of the silicon oxide film doped with nitrogen, and the floating gate electrode 204 made of the polycrystalline silicon film 204 doped with n-type impurities. The above electrodes and the film are patterned by photolithography and dry etching techniques. In this process, though not illustrated, a word line integrated with the control gate electrode 207 is also formed. FIG. 3(b) shows the process up to this step.

Then, the active region of the surface of the p-type semiconductor substrate 201 is locally doped with p-type impurities (e.g. boron) by the ion implantation method to form the punch-through stopper region 208 comprising a p-type semiconductor region.

Figure 3C:
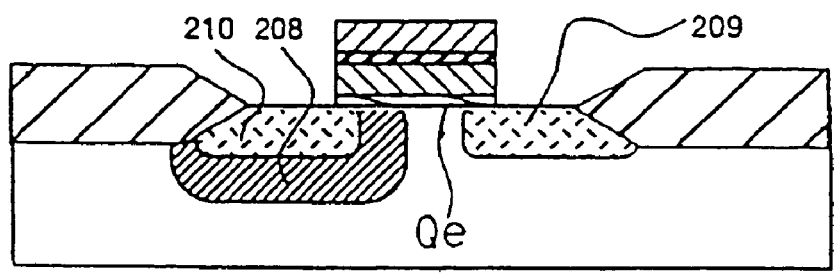

Then, the active region of the surface of the p-type semiconductor substrate 201 is locally doped with n-type impurities (e.g. arsenic) by the ion implantation method to form the source region 209 and drain region 210 comprising a pair of n-type semiconductor regions. In this process, a nonvolatile memory device Qe is formed. FIG. 3(c) shows the process up to this step.

Then, the interlayer dielectric film 211 is formed on the entire surface of the p-type semiconductor substrate 201 including the surface of the control gate electrode 207. Thereafter, a contact hole reaching the source region 209 and drain region 210 is formed on the interlayer dielectric film 211.

Then, a memory cell using the nonvolatile memory device Qe shown in FIG. 1 as one memory unit is almost completed by forming a metallic film on the entire surface of the interlayer dielectric film 211 including the contact hole and thereafter patterning the metallic film to form the electrodes 212.

Characteristics of the nonvolatile memory device Qe formed by the above fabrication method are described below. In this case, samples made by variously changing annealing temperatures and times in an $NH_3$ environment were prepared to compare the nitrogen atomic concentration and leakage current of the silicon oxide film (second gate dielectric film) 205 and characteristics of the nonvolatile memory device Qe.

Figure 4:
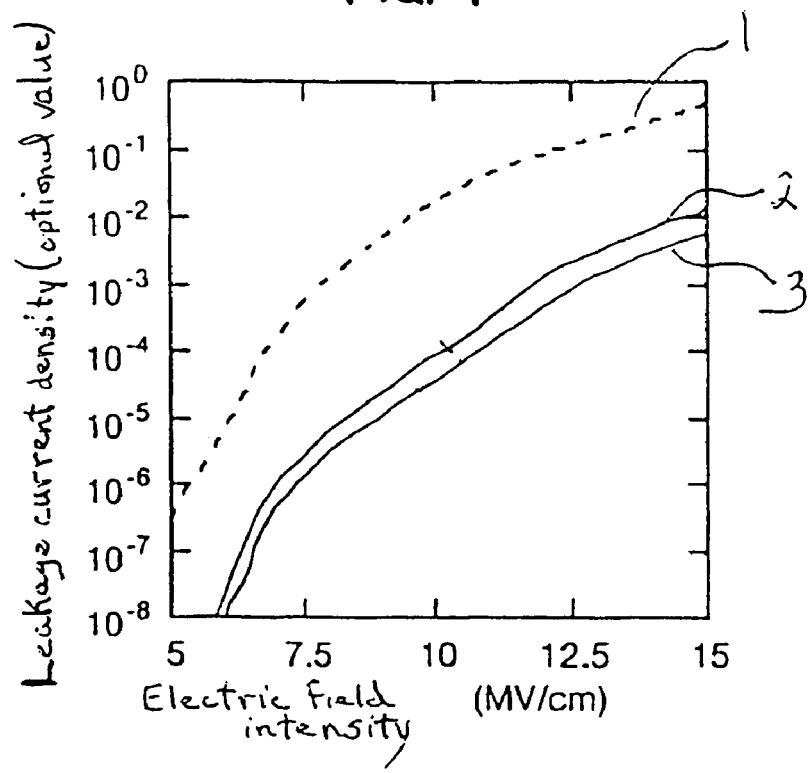
FIG. 4 is an illustration showing the relation between electric field and leakage current of a silicon oxide film.
Figure 5:
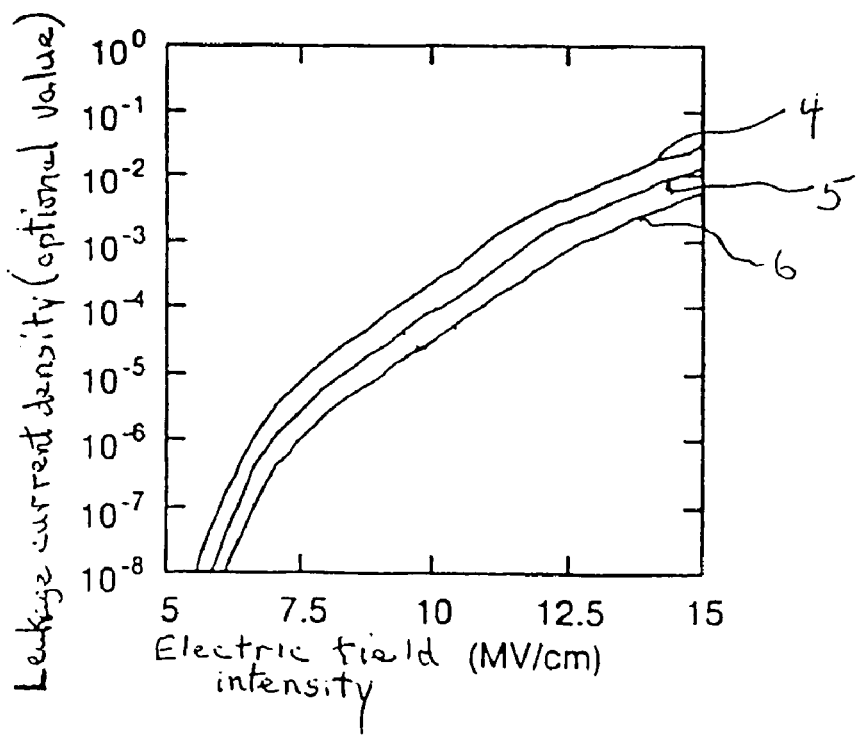
FIG. 5 is an illustration showing the relation between electric field and leakage current of a silicon oxide film.

FIGS. 4 and 5 show current-voltage characteristics of the silicon oxide film 205. FIG. 4 shows the result obtained by setting the annealing temperature in an $NH_3$ environment to 850° C. and changing annealing times, and FIG. 5 shows the result obtained by setting the annealing time to 10 min and changing annealing temperatures. The film thickness is set to 12 nm in the both cases. In FIG. 4, curve 1 represents no annealing (prior art); and curves 2 and 3 respectively represent annealing times of 10 minutes and 40 minutes (illustrating the present invention). In FIG. 5, curves 4, 5 and 6 respectively represent annealing temperatures of 800° C., 850° C. and 900° C. From the results in FIGS. 4 and 5, it is found that the leakage current of the silicon oxide film 205 decreases as the annealing time and temperature in the $NH_3$ environment increase.

Figure 6:
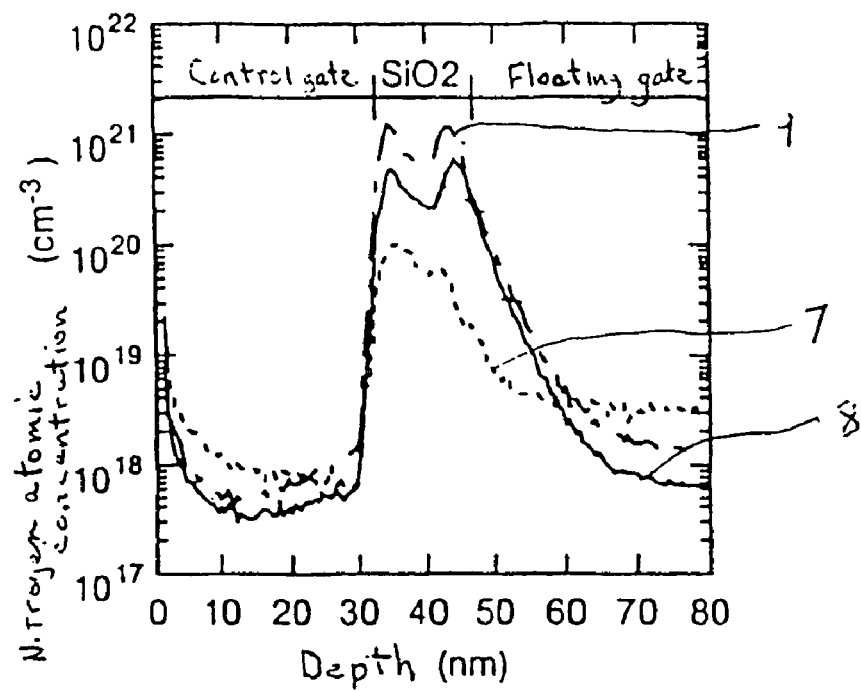
FIG. 6 is an illustration showing nitrogen atomic concentration distributions in a silicon oxide film.

The leakage current decrease described above has a close correlation with the nitrogen atomic concentration of the silicon oxide film 205. FIG. 6 shows the result of measuring the nitrogen atom distributions in the ranges of the control gate electrode (polycrystalline silicon film 207), second gate dielectric film (silicon oxide film 205), and floating gate electrode (polycrystalline silicon film 204) by a secondary ion mass spectrometer (SIMS). Curve 7 represents nitrogen atom distribution without annealing (prior art), while curves 8 and 9 represent nitrogen atom distributions respectively with annealing times of 10 minutes and 40 minutes.

From the annealing in the $NH_3$ environment, it is found that nitrogen atoms of $2\times10^{20}$ atoms/cm$^3$ or more are introduced into the silicon oxide film 205. The nitrogen atomic concentration of the silicon oxide film 205 is higher in the top and bottom regions than in the middle region. Moreover, it is found that the nitrogen atomic concentration rises as the annealing time in the $NH_3$ environment increases.

Figure 7:
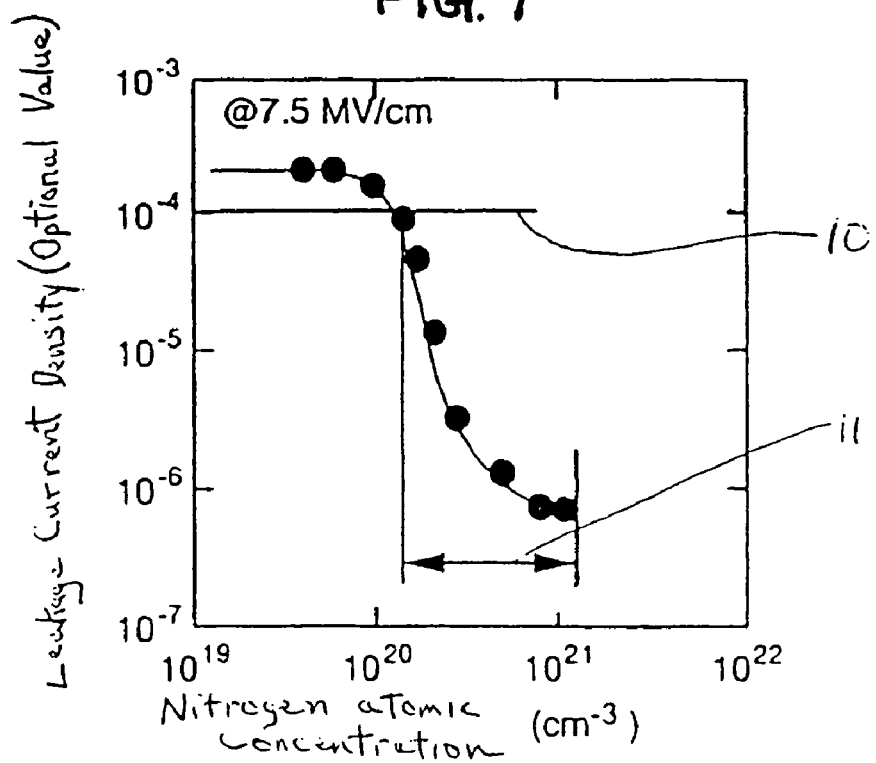
FIG. 7 is an illustration showing the relation between nitrogen atomic concentration and leakage current in a silicon oxide film.

FIG. 7 shows the relation between nitrogen atomic concentration and leakage current of the silicon oxide film 205 when annealing the film 205 at various temperatures and times. In this case, the nitrogen atomic concentration of the silicon oxide film 205 uses the value at the bottom region of the film 205. The leakage current is defined by the maximum electric field of 7.5 MV/cm applied to the second gate dielectric film 205 when injecting electrons into the floating gate electrode 204. From this result, it is found that the leakage current of the silicon oxide film 205 is dependent on the nitrogen atomic concentration of the film 205 independently of any annealing condition, and it decreases as the nitrogen atomic concentration increases. To secure the threshold voltage window at the time of writing/erasing and maintain the retention characteristic, it is necessary to decrease the leakage current of the second gate dielectric film 205 to $10^{-4}$ or less (the allowable leakage current density, shown by curve 10 in FIG. 7). From FIG. 7, to realize the above current level, it is necessary to increase the nitrogen atomic concentration in the silicon oxide film 205 to $2\times10^{20}$ atoms/cm$^3$ or more.

To fabricate a scaled nonvolatile memory device Qe having a gate length of 0.5 μm or less, it is necessary to set the upper limit of a process temperature to 900° C. or lower. As the result of measuring the nitrogen atomic concentration in the silicon oxide film 205 on the samples obtained by setting the annealing temperature of the film 205 in $NH_3$ to 900° C. and changing the annealing times of the film 205 by the above-described SIMS analysis, the concentration is saturated at approximately $2\times10^{21}$ atoms/cm$^3$ and it is difficult to introduce more nitrogen atoms. Therefore, the nitrogen atomic concentration in the silicon oxide film 205 is limited to a range between approximately $2\times10^{20}$ atoms/cm$^3$ or more and preferably $2\times10^{21}$ atoms/cm$^3$ or less (a region for practical fabrication and use of the device-shown by arrow 11 in FIG. 7).

Figure 8:
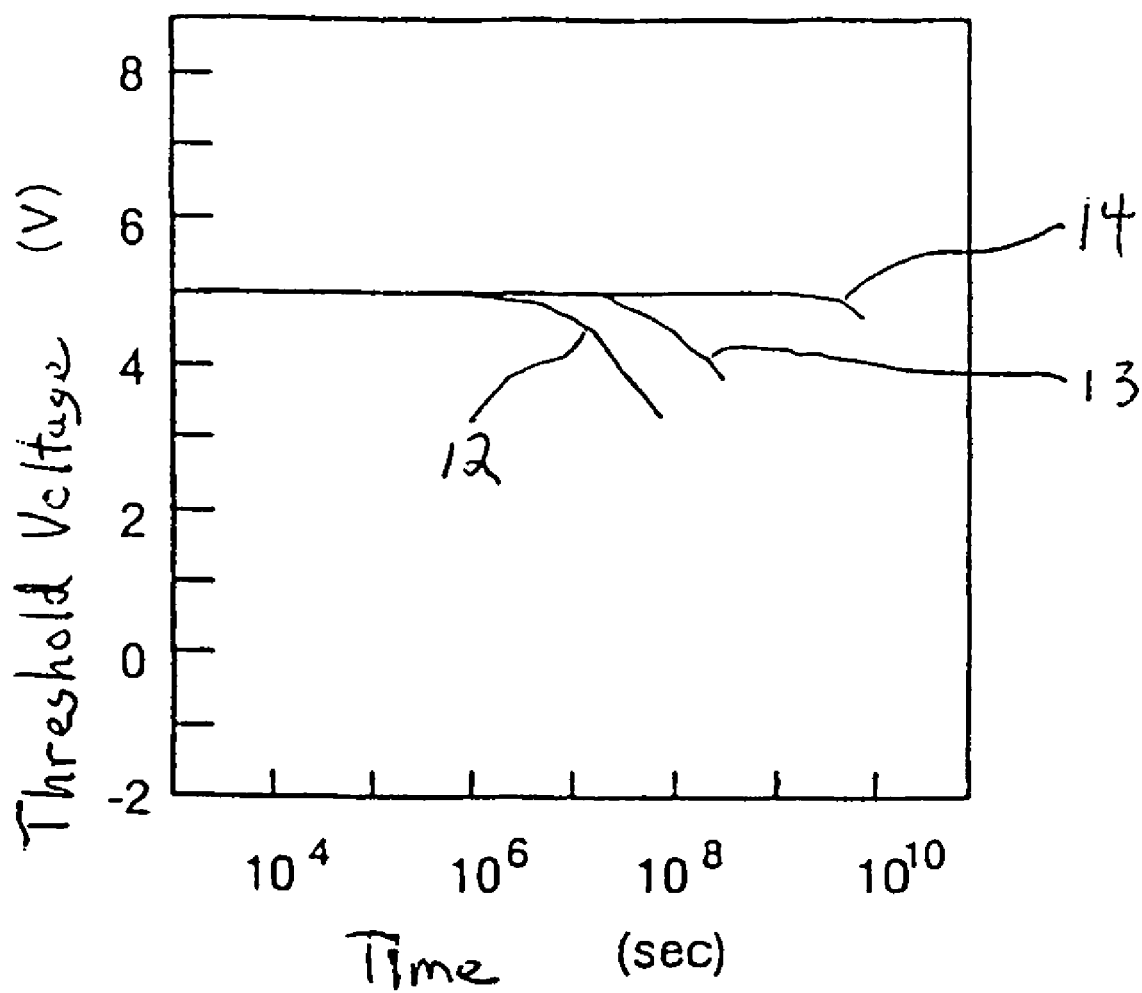
FIG. 8 is an illustration showing retention capability.

FIG. 8 shows the change of threshold voltage when doping the silicon oxide film 205 with nitrogen atoms in an $NH_3$ environment for 10 min, injecting electrons into the floating gate electrode 204 of the nonvolatile memory device Qe, and thereafter performing baking in a nitrogen environment at 250° C. FIG. 8 also shows the results of a thermal silicon oxide film 12 and an ONO film 13 of the prior art, in addition to those of the second gate dielectric film 205 (curve 14 in FIG. 8). Every film thickness is set to 12 nm.

It is found that the silicon oxide film 205 annealed in an $NH_3$ environment has a small threshold-voltage drop compared to the conventional thermal silicon oxide film and ONO film, and the retention capability of the nonvolatile memory device Qe is improved. This is, as described above, because the leakage current of the silicon oxide film 205 decreases compared to the case of the thermal silicon oxide film and ONO film when the thickness of the second gate dielectric film 205 is decreased to 12 nm. If the nitrogen atomic concentration in the silicon oxide film 205 is kept in a range between approximately $2\times10^{20}$ atoms/cm$^3$ and preferably $2\times10^{21}$ atoms/cm$^3$ or less, the retention capability was almost the same.

According to this embodiment, by using the thermal silicon oxide film 205 containing nitrogen-atoms in a range between approximately $2\times10^{20}$ atoms/cm$^3$ or more and preferably $2\times10^{21}$ atoms/cm$^3$ or less as the second gate dielectric film 205 of a nonvolatile memory device Qe, there is an advantage that the retention capability is improved.

Embodiment 2

For this embodiment, a case is described in which a silicon oxide film obtained by having the maximum nitrogen atomic concentration of the film in a range between approximately $2\times10^{20}$ atoms/cm$^3$ or more and preferably $2\times10^{21}$ atoms/cm$^3$ or less, optimizing the nitrogen distribution, and decreasing the hydrogen atomic concentration in the film, is used as the second gate dielectric film of a nonvolatile memory device.

First, a method for fabricating a memory cell using a nonvolatile memory device as one memory unit is described below by referring to FIGS. 9(a) to 9(c) and FIGS. 10(a) to 10(d) (cross-sectional views for explaining the fabrication method).

Figure 9A:
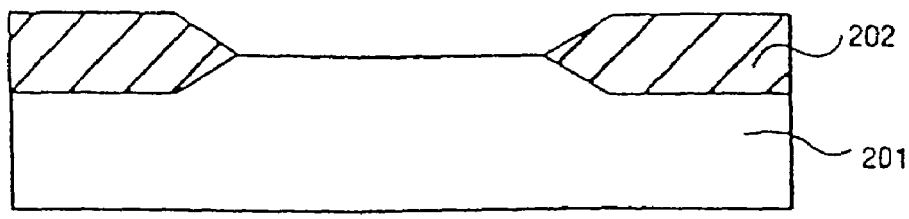
FIGS. 9(a) to 9(c) are cross-sectional views for explaining a method for fabricating the flash memory (semiconductor device) of the embodiment 2 of the preset invention.

A p-type semiconductor substrate 201 made of single-crystal silicon and having a surface orientation (100) is prepared, and then, a field insulator film 202 made of a silicon oxide film is formed in the inactive region of the surface of the p-type semiconductor substrate 201 by the generally-known local oxidation. The field insulator film 202 is formed at a thickness of approximately 500 nm. FIG. 9(a) shows the process up to this step for this embodiment.

Then, thermal oxidation is applied to the active region of the surface of the p-type semiconductor substrate 201 to form a first gate dielectric film 203 made of a silicon oxide film. The first gate dielectric film 203 is formed at a thickness of approximately 10 nm.

Then, a polycrystalline silicon film 204 doped with n-type impurities (e.g. phosphorus) is formed on the entire surface of the p-type semiconductor substrate. 201 including the surface of the first gate dielectric film 203. The polycrystalline silicon film 204 is formed at a thickness of approximately 200 nm.

Figure 9B:
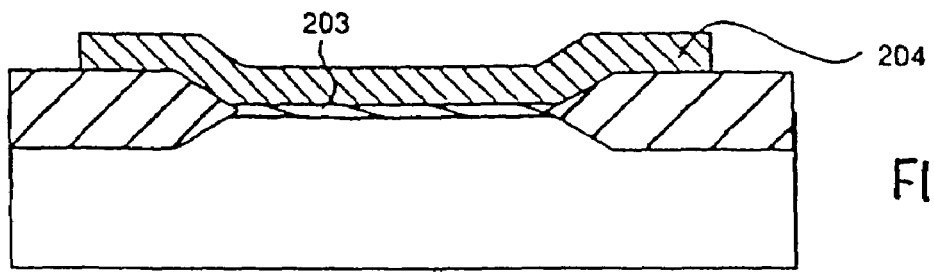

Then, patterning is applied to the polycrystalline silicon film 204. This patterning is performed by photolithography and the dry etching techniques. FIG. 9(b) shows the process up to this step.

Then, a silicon oxide film 205 is formed on the entire surface of the p-type semiconductor substrate 201 including the surface of the polycrystalline silicon film 204 at a thickness of, for example, 12 nm. The silicon oxide film 205 is formed by the LPCVD process using $SiH_4$ and $N_2O$ as source gases. In this case, the formation temperature is 750° C.

Then, annealing is performed in an $NH_3$ environment immediately after the above step is executed to introduce nitrogen atoms of approximately $6\times10^{20}$ atoms/cm$^3$ into the silicon oxide film 205.

Figure 9C:
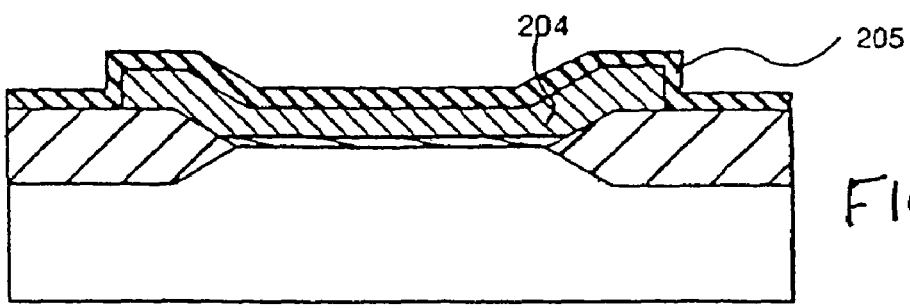

Then, wet oxidation is applied to the silicon oxide film 205 in an environment at a temperature of 825° C. FIG. 9(c) shows the process up to this 5 step.

Figure 10A:
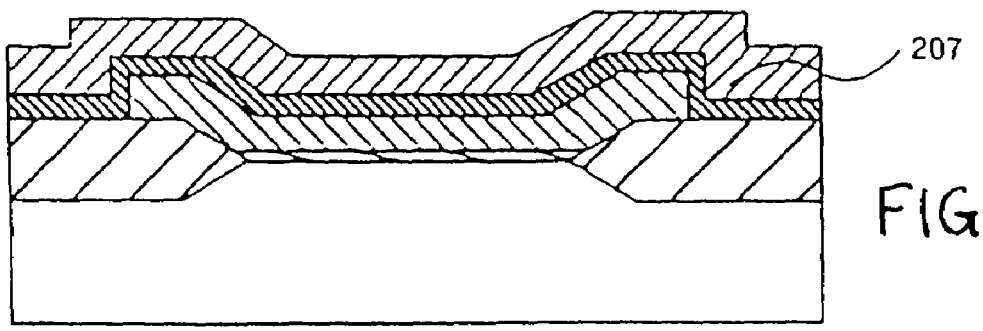
FIGS. 10(a) to 10(d) are cross-sectional views for explaining a method for fabricating the flash memory in FIGS. 9(a) to 9(c)

Then, a polycrystalline silicon film 207 doped with n-type impurities (e.g. phosphorus) is formed on the entire surface of the silicon oxide film 205. The polycrystalline silicon film 207 is formed at a thickness of approximately 200 nm. FIG. 10(a) shows the process up to this step.

Figure 10B:
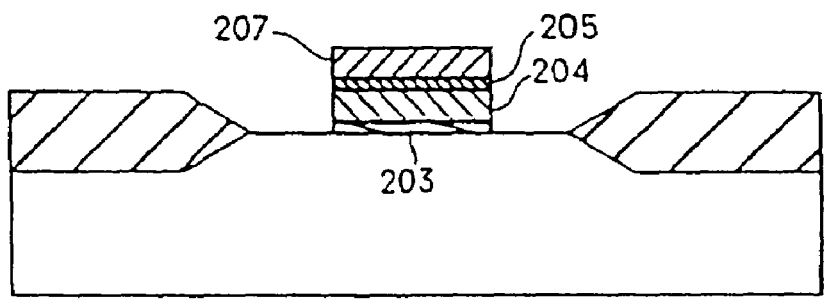

Patterning for specifying the width in the gate length direction is applied to the polycrystalline silicon film 207, silicon oxide film 205, and polycrystalline silicon film 204 in order so as to form a control gate electrode 207 made of the polycrystalline silicon film 207 doped with n-type impurities, a second gate dielectric film 205 made of the silicon oxide film 205 doped with nitrogen, and a floating gate electrode 204 made of the polycrystalline silicon film 204 doped with n-type impurities. Patterning of these electrodes and film are performed by photolithography and dry etching techniques. In the above step, though not illustrated, a word line integrated with the control gate electrode 207 is also formed. FIG. 10(b) shows the process up to this step.

Then, the active region of the surface of the p-type semiconductor substrate 201 is locally doped with p-type impurities (e.g. boron) by the ion implantation method to form a punch-through stopper region 208 comprising a p-type semiconductor region.

Figure 10C:
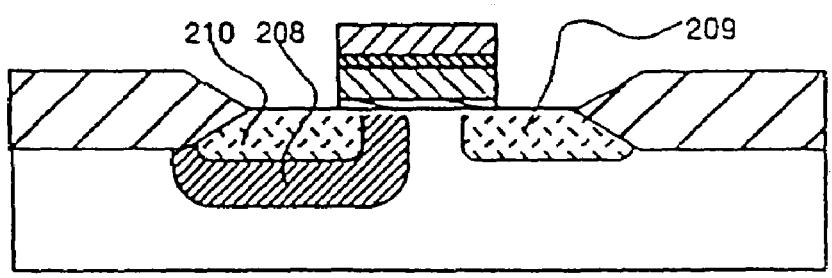

Then, the active region of the surface of the p-type semiconductor substrate 201 is locally doped with n-type impurities (e.g. arsenic) by the ion implantation method to form a source region 209 and a drain region 210 comprising a pair of n-type semiconductor regions. In this step, a nonvolatile memory device Qe is formed. FIG. 10(c) shows the process up to this step.

Then, an interlayer dielectric film 211 is formed on the entire surface of the p-type semiconductor substrate 201 including the surface of the control gate electrode 207, and thereafter, contact holes reaching the source region 209 and the drain region 210 are formed on the interlayer dielectric film 211.

Figure 10D:
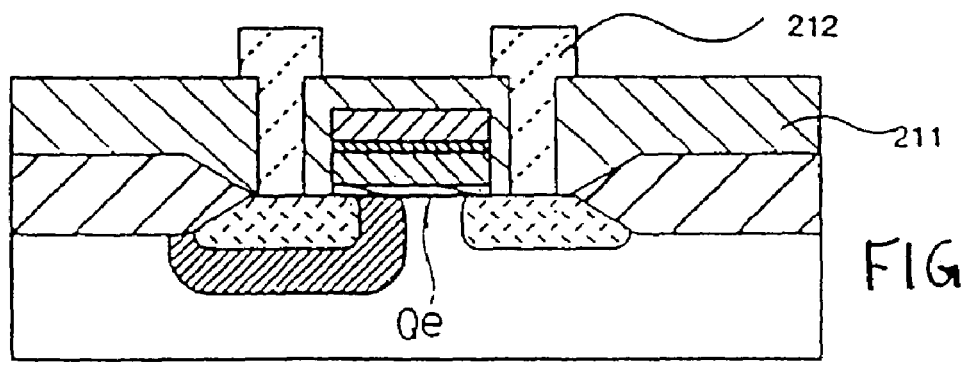

Then, a metallic film is formed on the entire surface of the interlayer dielectric film 211 including the inside of the contact holes, and thereafter, patterned to form electrodes 212. Thus, as shown in FIG. 10(d), a memory cell using a nonvolatile memory device Qe as one memory unit is almost completed.

The nonvolatile memory device Qe of this embodiment can hold electric charges for a long time compared to the case of the embodiment 1. To examine the reason for this, atomic-concentration distributions in the silicon oxide film 205 before and after wet oxidation were observed by a secondary ion mass spectrometer.

Figure 11:
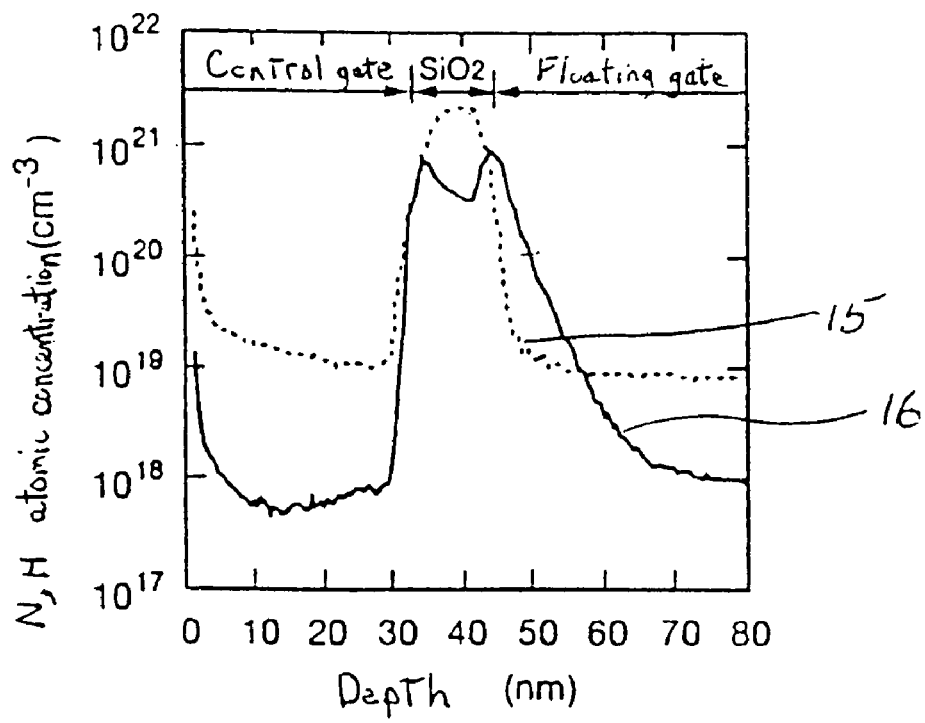
FIG. 11 is an illustration showing nitrogen-and hydrogen-concentration distributions in a silicon oxide film.
Figure 12:
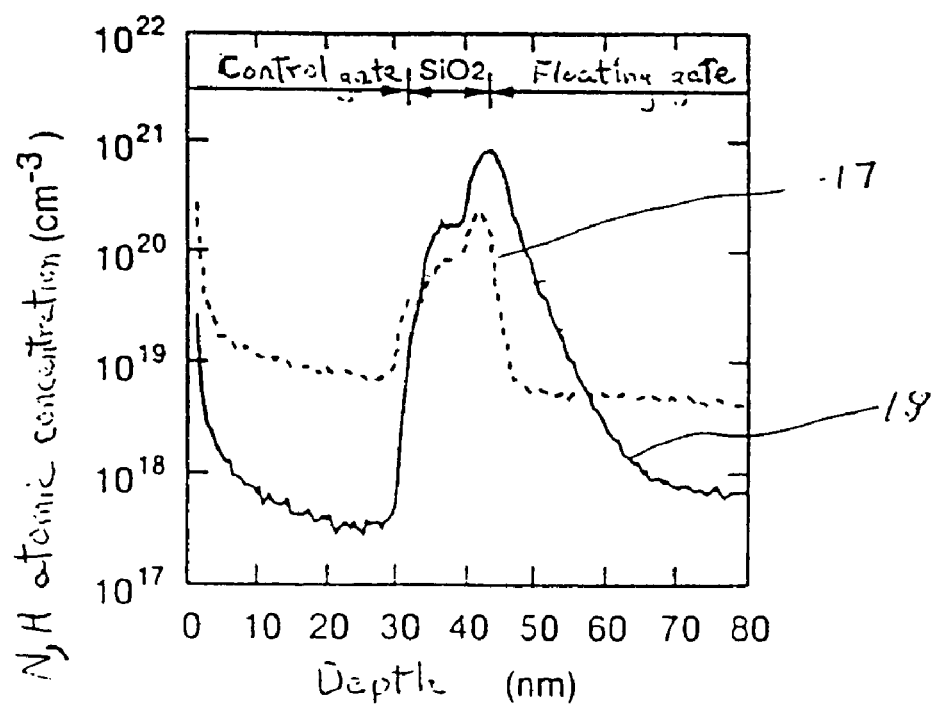
FIG. 12 is an illustration showing nitrogen-and hydrogen-concentration distributions in a silicon oxide film.

FIG. 11 shows nitrogen- and hydrogen-concentration distributions in the silicon oxide film 205 before wet oxidation and FIG. 12 shows nitrogen- and hydrogen-concentration distributions in the silicon oxide film 205 after wet oxidation. In FIG. 11, curves 15 and 16 respectively show concentrations of hydrogen and nitrogen in the silicon oxide film 205. In FIG. 12, curves 17 and 18 respectively show concentrations of hydrogen and nitrogen in the silicon oxide film. As the result of comparing FIGS. 11 and 12, it is found that the hydrogen atomic concentration in the silicon oxide film 205 decreases by one digit from $2 \times 10^{21}$ atoms/cm$^3$ to $2 \times 10^{20}$ atoms/cm$^3$. Moreover, it is confirmed that the nitrogen concentration in the top region (control gate electrode 207 side) of the silicon oxide film 205 decreases. After annealing in the nitrogen-containing environment (atmosphere), but without performing the wet oxidation, a nitrogen concentration profile of the silicon oxide film would have three regions, first and third regions respectively adjacent the control and floating gate electrodes, and a second region between the first and third region; the first and third regions would have substantially a same concentration, while the second region would have a reduced concentration relative to that of the first and third regions. After performing wet oxidation, the nitrogen concentration is reduced in the first region (i.e., adjacent the control gate electrode), but not in the third region; the nitrogen concentration in the third region is then much greater than that in the first region. Thus, the wet oxidation has two beneficial effect: 1) reduces the hydrogen concentration in the silicon oxide film; and 2) reduces nitrogen concentration in the silicon oxide film in the region adjacent the control gate electrode.

From the above analysis results, it is estimated that the reduction of electron traps due to reduction of hydrogen atoms in the silicon oxide film 205 and control of hole current due to reduction of the nitrogen concentration in the top region (control gate electrode 207 side) improve the retention capability of the nonvolatile memory device Qe.

In the case of this embodiment, the nitrogen atomic concentration in the silicon oxide film 205 is set to $6 \times 10^{20}$ atoms/cm$^3$. However, it is observed that the retention capability is improved when the nitrogen atomic concentration is kept in a range between approximately $2 \times 10^{20}$ atoms/cm$^3$ or more and preferably $2 \times 10^{21}$ atoms/cm$^3$ or less. Moreover, when the hydrogen atomic concentration in the silicon oxide film 205 is kept at $5 \times 10^{20}$ atoms/cm$^3$ or less, the retention capability is also improved. Furthermore, by setting the hydrogen atomic concentration in the silicon oxide film 205 to $5 \times 10^{20}$ atoms/cm$^3$ or less, it is possible to control the threshold voltage change due to programming/erasing of a nonvolatile memory device Qe. FIG. 20 shows threshold voltage change values due to programming/erasing before and after reduction of hydrogen atoms due to wet oxidation. In FIG. 20, curve 19 shows threshold voltage change values before wet oxidation, and curve 20 shows threshold voltage change values after wet oxidation. In this case, the nitrogen atomic concentration is $6 \times 10^{20}$ atoms/cm$^3$. Though the threshold voltage change is 0.65 V before wet oxidation (hydrogen atomic concentration of $3 \times 10^{21}$ atoms/cm$^3$), it is controlled to approximately 0.15 V after wet oxidation (hydrogen atomic concentration of $3 \times 10^{20}$ atoms/cm$^3$). This is because electron traps in the silicon oxide film 205 are reduced by reducing hydrogen atoms by wet oxidation.

Furthermore, in the case of this embodiment, the nitrogen atomic concentration in the silicon oxide film 205 is set to $6 \times 10^{20}$ atoms/cm$^3$. However, it is possible to control the threshold voltage change due to programming/erasing by keeping the nitrogen atomic concentration in a range between approximately $2 \times 10^{20}$ atoms/cm$^3$ or more and preferably $2 \times 10^{21}$ atoms/cm$^3$ or less and the hydrogen atomic concentration at $5 \times 10^{20}$ atoms/cm$^3$ or less.

This embodiment has an advantage that the retention capability of a nonvolatile memory device Qe can be improved by using the silicon oxide film 205 containing nitrogen atoms in a range between approximately $2 \times 10^{20}$ atoms/cm$^3$ or more and preferably $2 \times 10^{21}$ atoms/cm$^3$ or less as the second gate dielectric film 205 of the nonvolatile memory device Qe, and, moreover, increasing the nitrogen atomic concentration in the bottom region of the silicon oxide film 205 compared to the nitrogen atomic concentration in the top region of the film 205 and setting the maximum hydrogen atomic concentration in the silicon oxide film 205 to $5 \times 10^{20}$ atoms/cm$^3$ or less. Moreover, the embodiment has an advantage that the threshold voltage change due to programming/erasing of the nonvolatile memory device Qe can be controlled.

Embodiment 3

For this embodiment, a silicon oxide film in which the maximum nitrogen atomic concentration is kept in a range between approximately $2 \times 10^{20}$ atoms/cm$^3$ or more and preferably $2 \times 10^{21}$ atoms/cm$^3$ or less, with a silicon nitride ($Si_3N_4$) film superimposed on the silicon oxide film, used as the second gate dielectric film of a nonvolatile memory device, is described.

First, a method for fabricating a memory cell using a nonvolatile memory device as one memory unit is described below by referring to FIGS. 13(a) to 13(d) and FIGS. 14(a) to 14(d) (cross-sectional views for explaining the fabrication method).

Figure 13A:
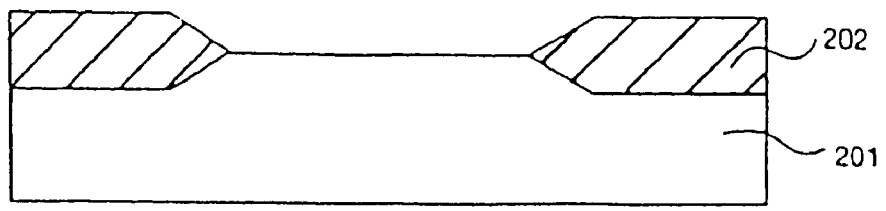
FIGS. 13(a) to 13(d) are cross-sectional views for explaining a method for fabricating the flash memory (semiconductor device) of the embodiment 3 of the present invention.

A p-type semiconductor substrate 201 made of single-crystal silicon and having a surface orientation (100) is prepared, and then a field insulator film 202 made of a silicon oxide film is formed in the inactive region of the surface of the p-type semiconductor substrate 201 by the generally-known local oxidation. The field insulator film 202 is formed at a thickness of approximately 500 nm. FIG. 13(a) shows the process up to this step for this embodiment.

Then, thermal oxidation is applied to the active region of the surface of the p-type semiconductor substrate 201 to form a first gate dielectric film 203 made of a silicon oxide film. The first gate dielectric film 203 is formed at a thickness of approximately 10 nm.

Then, a polycrystalline silicon film 204 doped with n-type impurities (e.g. phosphorus) is formed on the entire surface of the p-type semiconductor substrate 201 including the surface of the first gate dielectric film 203. The polycrystalline silicon film 204 is formed at a thickness of approximately 200 nm.

Figure 13B:
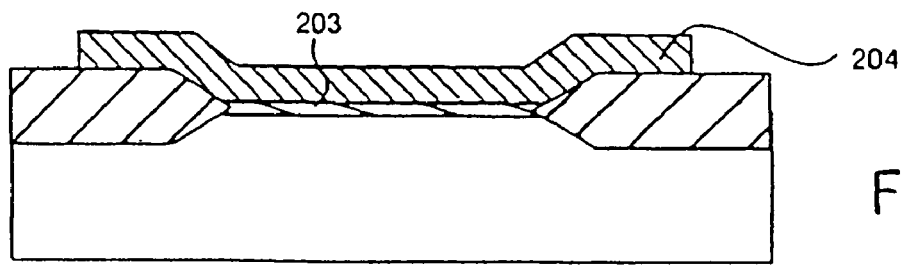

Then, the polycrystalline silicon film 204 is patterned. This patterning is performed by photolithography and dry etching techniques. FIG. 13(b) shows the process up to this step.

Then, a silicon oxide film 205 is formed on the entire surface of the p-type semiconductor substrate 201 including the surface of the polycrystalline silicon film 204 at a thickness of, for example, 12 nm. The silicon oxide film 205 is formed by the LPCVD process using $SiH_4$ and $N_2O$ as source gases. In this case, the formation temperature is 750° C.

Figure 13C:
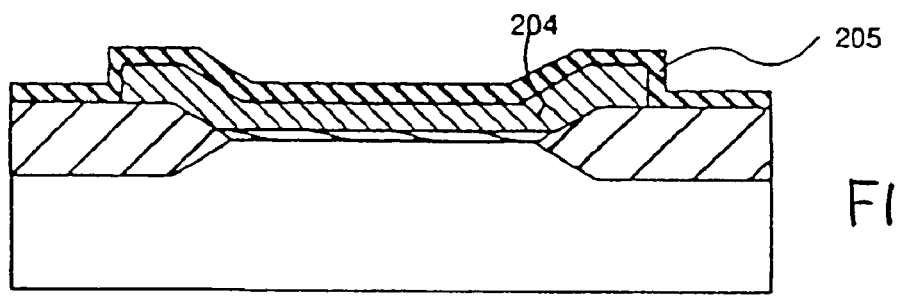

Then, annealing is performed in an $NH_3$ environment immediately after the above step is performed to introduce nitrogen atoms of approximately $6 \times 10^{20}$ atoms/cm$^3$ into the silicon oxide film 205. FIG. 13(c) shows the process up to this step.

Figure 13D:
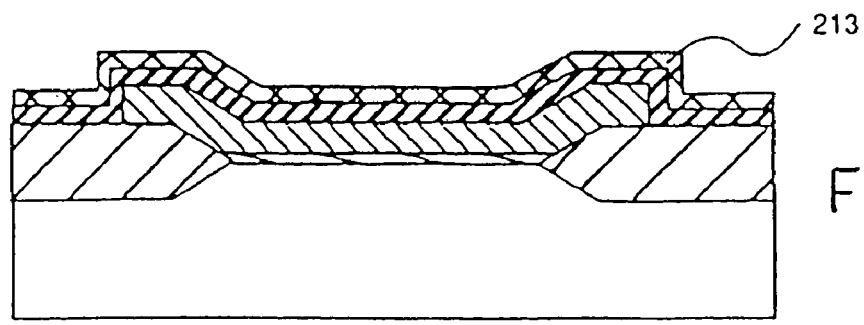

Then, a silicon nitride ($Si_3N_4$) film 213 (about 10 nm thickness) is formed on the entire surface of the p-type semiconductor substrate 201 including the surface of the silicon oxide film 205 by the LPCVD process. FIG. 13(d) shows the process up to this step.

Figure 14A:
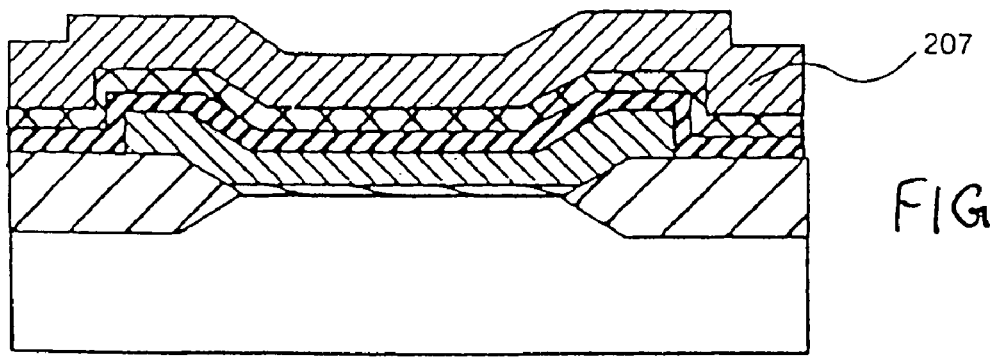
FIGS. 14(a) to 14(d) are cross-sectional views for explaining a method for fabricating the flash memory in FIGS. 13(a) to 13(d)

Then, a polycrystalline silicon film 207 doped with n-type impurities (e.g. phosphorus) is formed on the entire surface of the silicon oxide film 205. The polycrystalline silicon film 207 is formed at a thickness of approximately 200 nm. FIG. 14(a) shows the process up to this step.

Then, patterning for specifying the width in the gate length direction is applied to the polycrystalline silicon film 207, silicon nitride film 213, silicon oxide film 205, polycrystalline silicon film 204, and first gate dielectric film 203 in order so as to form a control gate electrode 207 made of the polycrystalline silicon film 207 doped with n-type impurities, a second gate dielectric film made of the silicon oxide film 205 doped with nitrogen and the silicon nitride film 213, and a floating gate electrode 204 made of the polycrystalline silicon film 204 doped with n-type impurities.

Figure 14B:
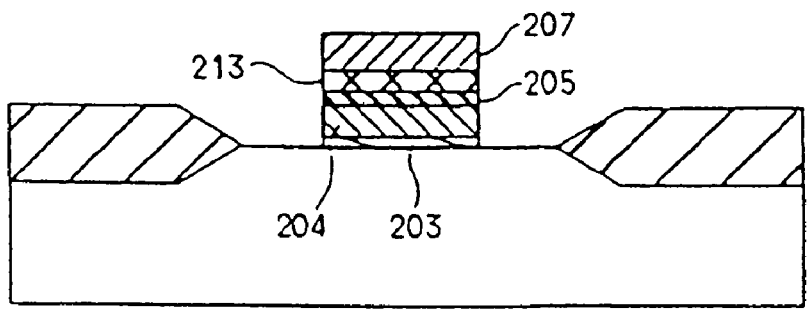

The above electrodes and film are patterned by photolithography and dry etching techniques. In the above step, though not illustrated, a word line integrated with the control gate electrode 207 is also formed. FIG. 14(b) shows the process up to this step.

Then, the active region of the surface of the p-type semiconductor substrate 201 is locally doped with p-type impurities (e.g. boron) by the ion implantation method to form a punch-through stopper region 208 comprising a p-type semiconductor region.

Figure 14C:
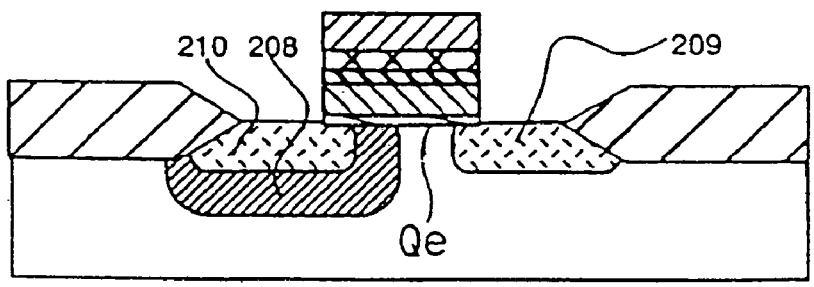

Then, the active region of the surface of the p-type semiconductor substrate 201 is locally doped with n-type impurities (e.g. arsenic) by the ion implantation method to form a source region 209 and a drain region 210 comprising a pair of n-type semiconductor regions. In this step, a nonvolatile memory device Qe is formed. FIG. 14(c) shows the process up to this step.

Then, an interlayer dielectric film 211 is formed on the entire surface of the p-type semiconductor substrate 201 including the surface of the control gate electrode 207, and thereafter, contact holes reaching the source region 209 and drain region 210 are formed through the interlayer dielectric film 211.

Figure 14D:
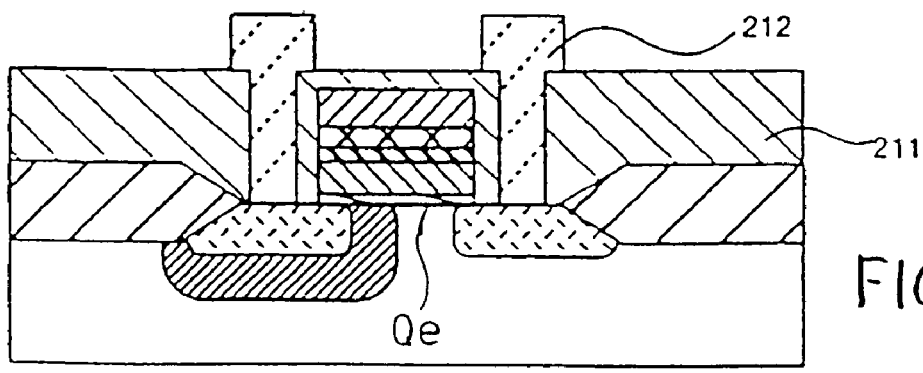

Then, a metallic film is formed on the entire surface of the interlayer dielectric film 211 including the inside of the contact holes, and thereafter, patterned to form electrodes 212. Thus, as shown in FIG. 14(d), a memory cell using a nonvolatile memory device Qe as one memory unit is almost completed.

The retention capability of the nonvolatile memory device Qe is improved compared to the case of depositing a silicon nitride film on an ONO film with a thickness of 12 nm.

In the case of this embodiment, the nitrogen atomic concentration in the silicon oxide film 205 is set to $6 \times 10^{20}$ atoms/cm$^3$ or more. However, when the concentration is kept in a range between approximately $2 \times 10^{20}$ atoms/cm$^3$ and preferably $2 \times 10^{21}$ atoms/cm$^3$ or less, improvement of the retention capability is observed.

This embodiment has an advantage that the retention capability of a nonvolatile memory device Qe can be improved by using, as the second gate dielectric film of the nonvolatile memory device Qe, the silicon oxide film 205 including nitrogen atoms in a range between approximately $2 \times 10^{20}$ atoms/cm$^3$ or more and $2 \times 10^{21}$ atoms/cm$^3$ or less and having the silicon nitride film 213 superimposed on the silicon oxide film 205.

Moreover, in the case of this embodiment, nitrogen atoms are introduced into the silicon oxide film 205, and, thereafter, the silicon nitride film 213 is formed. However, more advantages can be obtained by performing wet oxidation similarly to the case of the embodiment 2 before forming the silicon nitride film 213 and reducing the hydrogen atomic concentration in the silicon oxide film 205 to $5 \times 10^{20}$ atoms/cm$^3$ or less.

Embodiment 4

For this embodiment, a case is described in which a silicon oxide film in which the maximum nitrogen atomic concentration is kept in a range between approximately $2 \times 10^{20}$ atoms/cm$^3$ or more and preferably $2 \times 10^{21}$ atoms/cm$^3$ or less is used as the second gate dielectric film of a nonvolatile memory device. The nonvolatile memory device of this embodiment is mounted as a flash memory having an AND-type contactless array structure.

First, a method for fabricating a memory cell using a nonvolatile memory device as one memory unit is described below by referring to FIGS. 15(a) to 15(e) and FIGS. 16(a) to 16(d) (cross-sectional views for explaining the fabrication method).

A p-type semiconductor substrate 101 made of single-crystal silicon and having a surface orientation (100) is prepared.

Then, a first gate dielectric film 102 made of a silicon oxide film is formed on the surface of the p-type semiconductor substrate 101.

Then, a polycrystalline silicon film 103 doped with impurities (e.g. phosphorus) is formed on the first gate dielectric film 102, and, thereafter, a silicon oxide film 104 is formed on the polycrystalline silicon film 103 and then a silicon nitride film 105 is formed on the silicon oxide film 104. The polycrystalline silicon film 103, silicon oxide film 104, and silicon nitride film 105 are formed in order by the LPCVD process.

Figure 15A:
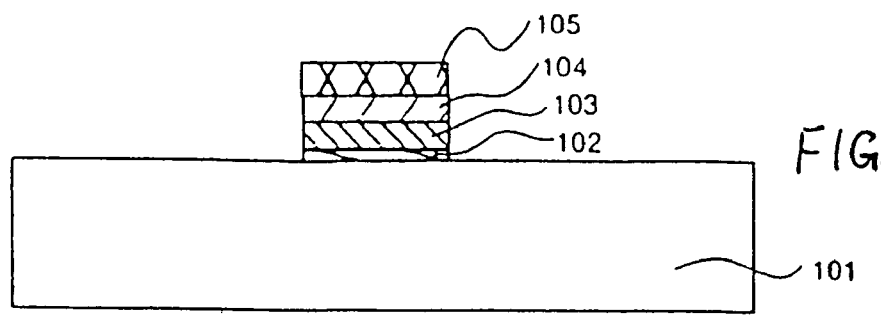
FIGS. 15(a) to 15(e) are cross-sectional views for explaining a method for fabricating the flash memory (semiconductor device) of the embodiment 4 of the present invention.

Then, patterning for specifying the width in the gate length direction is applied to the silicon nitride film 105, silicon oxide film 104, polycrystalline silicon film 103, and first gate dielectric film 102. The patterning is performed by photolithography and dry etching techniques. FIG. 15(a) shows the process up to this step.

Figure 15B:
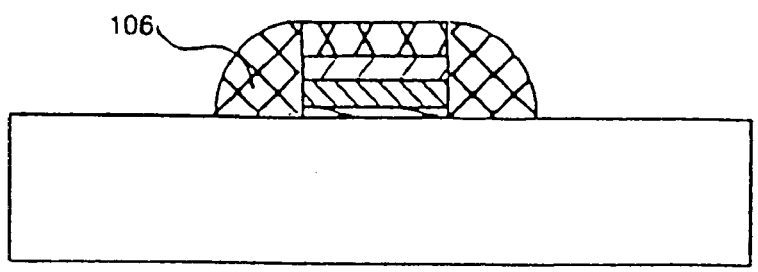

Then, a silicon nitride film is formed on the entire surface of the p-type semiconductor substrate 101, including the surface of the silicon nitride film 105, by the LPCVD process, and thereafter, anisotropic dry etching is applied to the silicon nitride film to form a sidewall spacer 106. FIG. 15(b) shows the process up to this step.

Figure 15C:
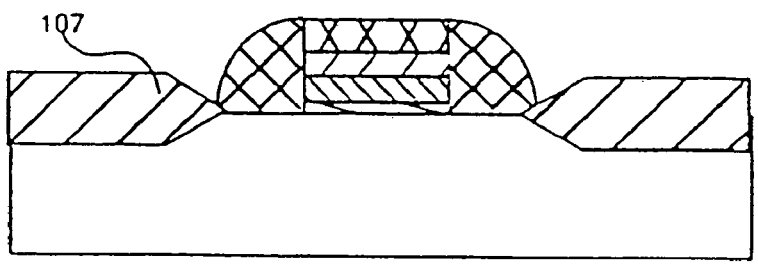

Then, wet oxidation is performed to form a field insulator film 107 made of a silicon oxide film on the surface of the p-type semiconductor substrate 101. The field insulator film 107 separates active regions (device forming regions). FIG. 15(c) shows the process up to this step.

Then, a hot phosphoric acid treatment is performed to remove the silicon nitride film 105 and sidewall spacer 106, and then, the active region of the surface of the p-type semiconductor substrate 101 is locally doped with p-type impurities (e.g. boron) by the ion implantation method to form a punch-through stopper region 108 comprising a p-type semiconductor region.

Figure 15D:
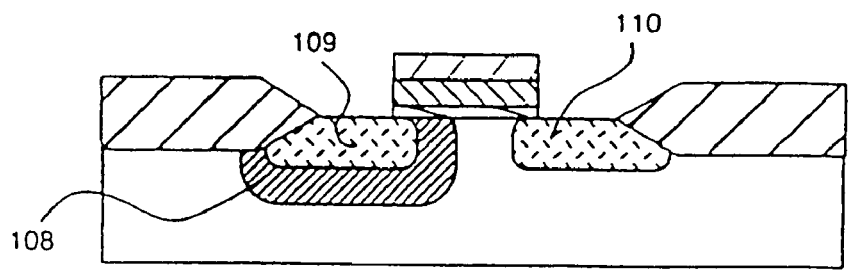

Then, the active region of the surface of the p-type semiconductor substrate 101 is locally doped with n-type impurities (e.g. arsenic) by the ion implantation method to form a source region 109 and a drain region 110 comprising a pair of n-type semiconductor regions. FIG. 15(d) shows the process up to this step.

Figure 15E:
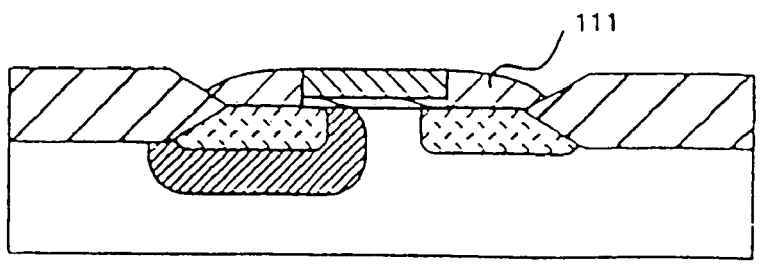

Then, a silicon oxide film 111 is formed on the entire surface of the p-type semiconductor substrate 101 including the surface of the silicon oxide film 104 by the LPCVD process, and thereafter, anisotropic etching is applied to the silicon oxide film 111 until the upside of the polycrystalline silicon film 103 is exposed. FIG. 15(e) shows the process up to this step.

Figure 16A:
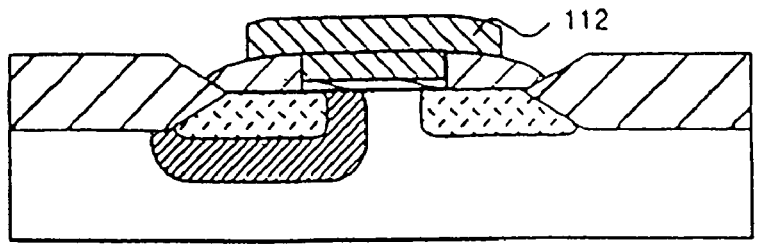
FIGS. 16(a) to 16(d) are cross-sectional views for explaining a method for fabricating the flash memory in FIGS. 15(a) to 15(e)

Then, a polycrystalline silicon film 112 doped with n-type impurities (e.g. phosphorus) is formed on the entire surface of the p-type semiconductor substrate 101 including the surface of the polycrystalline silicon film 103, and thereafter, patterning for specifying the width in the gate length direction is applied to the polycrystalline silicon film 112. FIG. 16(a) shows the process up to this step.

Then, a silicon oxide film 113 is formed on the entire surface of the p-type semiconductor substrate 101 including the surface of the polycrystalline silicon film 112 at a thickness of, for example, 12 nm. The silicon oxide film 113 is formed by the LPCVD process using $SiH_4$ and $N_2O$ as source gases. In this case, the formation temperature is 750° C.

Figure 16B:
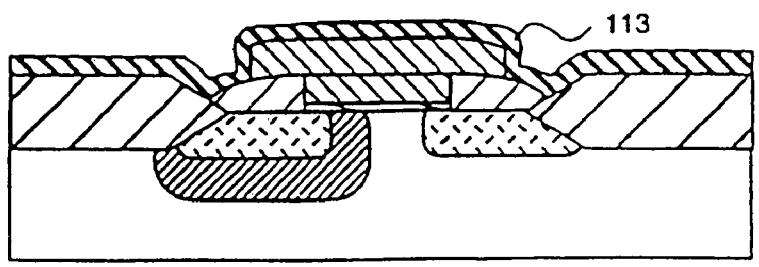

Then, annealing is performed in an $NH_3$ environment immediately after the above step is performed to introduce nitrogen atoms of approximately $6\times10^{20}$ atoms/cm$^3$ into the silicon oxide film 113. FIG. 16(b) shows the process up to this step.

Then, a polycrystalline silicon film 115 doped with n-type impurities (e.g. phosphorus) is formed on the entire surface of the silicon oxide film 113.

Figure 16C:
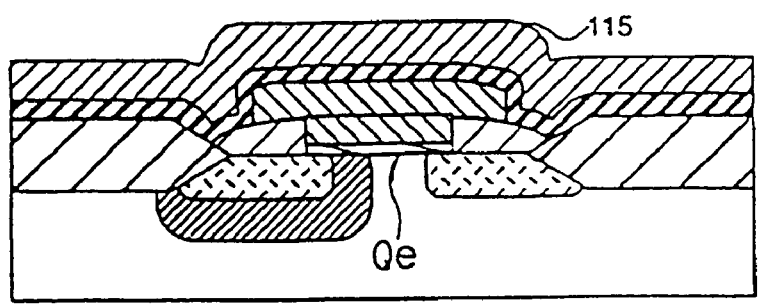

Then, patterning for specifying the width in the gate width direction is applied to the polycrystalline silicon film 115, silicon oxide film 113, polycrystalline silicon film 112, and polycrystalline silicon film 103 in order so as to form a control gate electrode 115 made of the polycrystalline silicon film 115 doped with n-type impurities, a second gate dielectric film 113 made of the silicon oxide film 113 doped with nitrogen, and a floating gate electrode made of the polycrystalline silicon films 112 and 103 doped with n-type impurities. The patterning of them is performed by photolithography and dry etching techniques. In this step, though not illustrated, a word line integrated with the control gate electrode 115 is also formed. FIG. 16(c) shows the process up to this step.

Figure 16D:
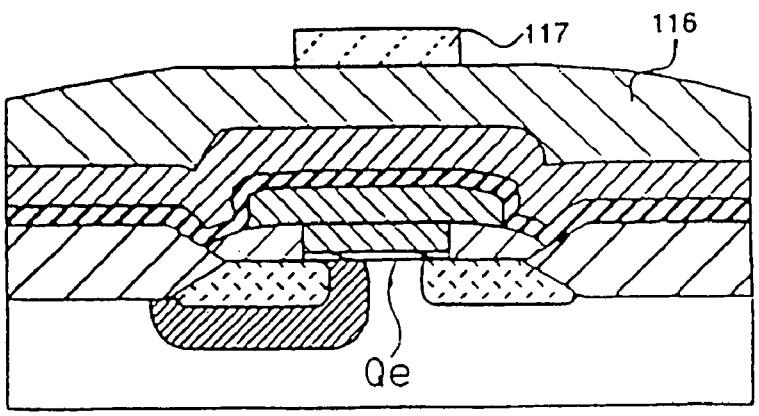

Then, an interlayer dielectric film 116 is formed on the entire surface of the p-type semiconductor substrate 101 including the surface of the control gate electrode 115, and thereafter, contact holes (though not illustrated in FIG. 16(d)) reaching the source region 109 and the drain region 110 are formed through the interlayer dielectric film 116.

Then, a metallic film is formed on the entire surface of the interlayer dielectric film 116 including the inside of the contact holes, and thereafter, patterned to form electrodes 117. Thus, a memory cell using a nonvolatile memory device Qe as one memory unit is almost completed.

The retention capability of the nonvolatile memory device Qe is improved compared to the case of using an ONO film with a thickness of 12 nm as a second gate dielectric film. To obtain a preferable retention capability similarly to the case of the embodiment 1, it is necessary to keep the nitrogen atomic concentration in the silicon oxide film 113 in a range between approximately $2\times10^{20}$ atoms/cm$^3$ or more and preferably $2\times10^{21}$ atoms/cm$^3$ or less.

Figure 17:
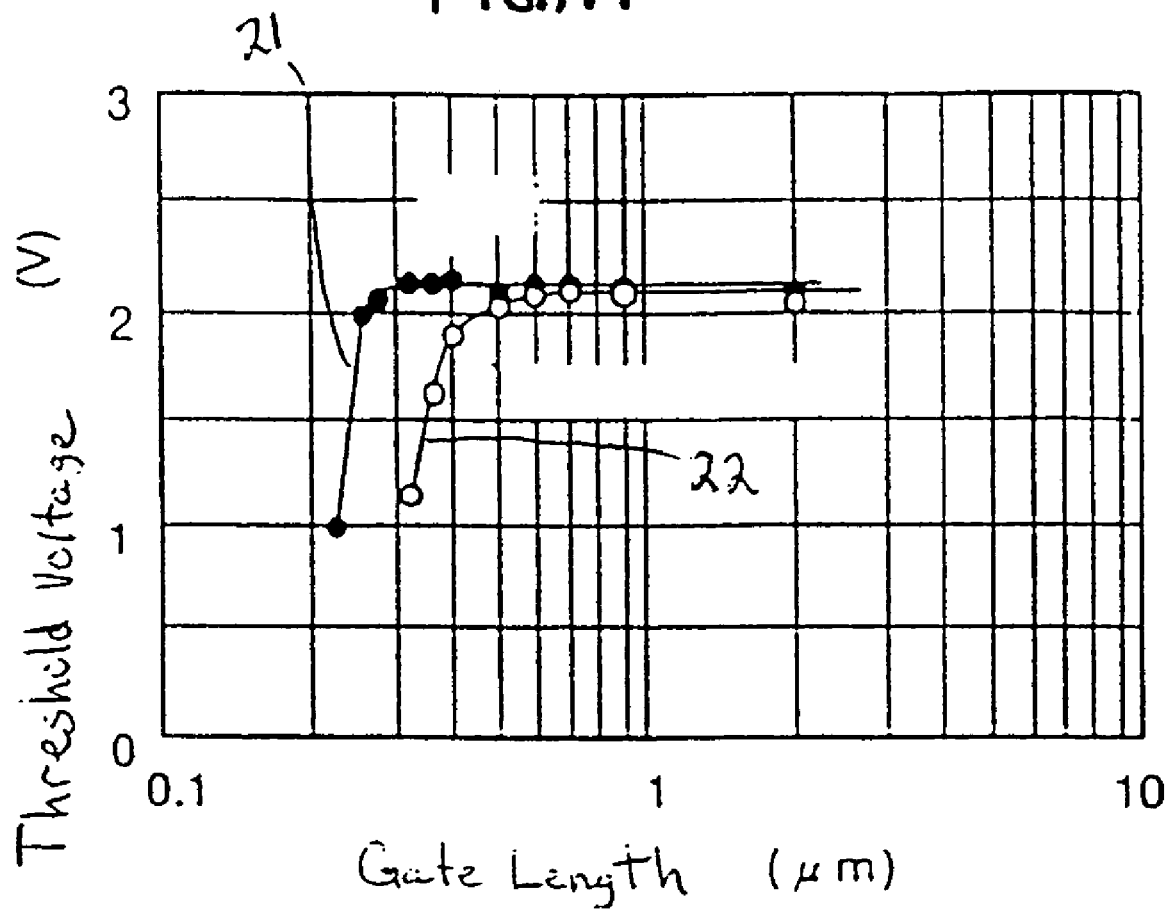
FIG. 17 is an illustration showing the relation between gate length and threshold voltage.

Moreover, FIG. 17 shows the relation between gate length of the nonvolatile memory device using the silicon oxide film 113 as a second gate dielectric film and threshold voltage of the nonvolatile memory device after ultraviolet light irradiation. In FIG. 17, curve 21 represents the present invention, and curve 22 represents structure using an ONO film (prior art) as a second gate dielectric film. The silicon oxide film annealed in an $NH_3$ environment can perform stable operations even if the gate length is shorter than that of a conventional ONO film, for example, 0.3 μm or less. This is because the silicon oxide film 113 has a formation temperature of 850° C. which is lower than that of the ONO film, and thereby, the elongation of the source and drain regions can be controlled.

This embodiment has an advantage that the retention capability can be improved by using the silicon oxide film 113 containing nitrogen atoms in a range between approximately $2\times10^{20}$ atoms/cm$^3$ or more and preferably $2\times10^{21}$ atoms/cm$^3$ or less as the second gate dielectric film of the nonvolatile memory device Qe.

Moreover, there is an advantage that a scaled nonvolatile memory device Qe can be stably operated by using a silicon oxide film in which the maximum nitrogen atomic concentration is kept in a range between approximately $2 \times 10^{20}$ atoms/cm$^3$ or more and preferably $2 \times 10^{21}$ atoms/cm$^3$ or less as the second gate dielectric film of the nonvolatile memory device Qe, after forming source and drain regions.

Furthermore, in the case of this embodiment, nitrogen atoms are introduced into the silicon oxide film 113 and thereafter the polycrystalline silicon film 115 is formed. However, more advantages can be obtained by performing wet oxidation before forming the polycrystalline silicon film 115 similarly to the case of the embodiment 2 and reducing the hydrogen atomic concentration in the silicon oxide film 113 to $5 \times 10^{20}$ atoms/cm$^3$ or less.

Furthermore, as described in the embodiment 3, the same advantage can be obtained by forming a silicon nitride film and using a second gate dielectric film as a composite film before forming the polycrystalline silicon film 115 after forming the silicon oxide film 113.

In the case of the embodiments 1 to 3, a nonvolatile memory device to be mounted as a NOR-type flash memory is described as an example. In the case of the embodiment 4, a nonvolatile memory device to be mounted as a flash memory having an AND-type contactless array structure is described as an example. Moreover, the same advantage can be obtained by applying the present invention to a nonvolatile memory device to be mounted as another nonvolatile semiconductor memory such as the NAND type, DiNOR type, or split-gate type. In the case of the Embodiments 1–4, the silicon oxide film in which the maximum nitrogen atomic concentration is kept in a range between approximately $2 \times 10^{20}$ atoms/cm$^3$ or and preferably at most $2 \times 10^{21}$ atoms/cm$^3$ is applied to the second gate dielectric film between the floating gate electrode and control gate electrode. However, by keeping the concentration of nitrogen atoms in a range of at least approximately $2 \times 10^{20}$ atoms/cm$^3$, and preferably at most $2 \times 10^{21}$ atoms/cm$^3$, the silicon oxide film can be applied to the interpoly dielectice film between the floating gate electrode and the erase gate electrode.

Embodiment 5

For this embodiment, a case of using a silicon oxide film in which the maximum nitrogen atomic concentration is kept in a range between approximately $2 \times 10^{20}$ atoms/cm$^3$ or more and preferably $2 \times 10^{21}$ atoms/cm$^3$ or less as the gate dielectric film of an MOS transistor using a polycrystalline silicon film as an active layer is described. In the case of this embodiment, a gate dielectric film represents an insulator film formed between the active layer and the gate electrode.

First, an MOS transistor fabrication method is described by referring to FIGS. 18(a) to 18(c) and FIGS. 19(a) to 19(d) (cross-sectional views for explaining the fabrication method).

An n-type semiconductor substrate 301 made of single-crystal silicon and having a surface orientation (100) is prepared.

Figure 18A:
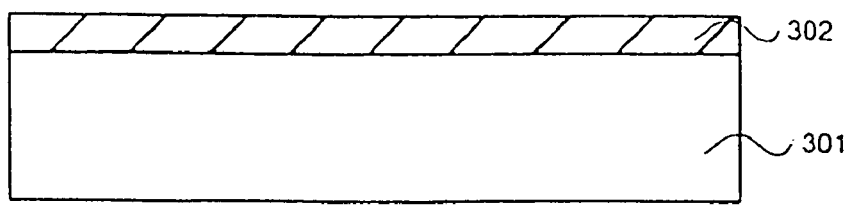
FIGS. 18(a) to 18(c) are cross-sectional views for explaining a method for fabricating the semiconductor device of the embodiment 5 of the present invention.

Then, a silicon oxide film 302 is formed on the surface of the n-type semiconductor substrate 301. FIG. 18(a) shows the process up to this step.

Figure 18B:
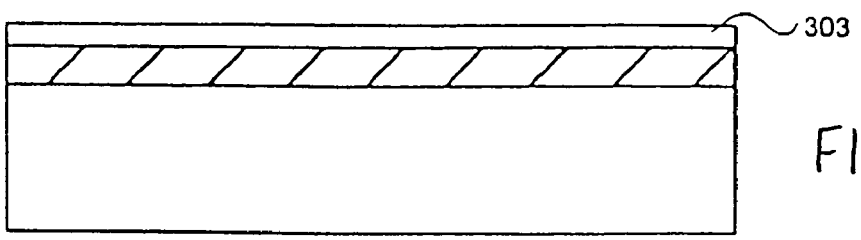

Then, a polycrystalline silicon film 303 serving as the active layer of an MOS transistor is formed on the silicon oxide film 302. FIG. 18(b) shows the process up to this step.

Then, a silicon oxide film 304 used as a gate dielectric film is formed on the polycrystalline silicon film 303 at a thickness of, for example, 10 nm. The silicon oxide film 304 is formed by the LPCVD process using SiH$_4$ and N$_2$O as source gases. In this case, the formation temperature is 750° C.

Figure 18C:
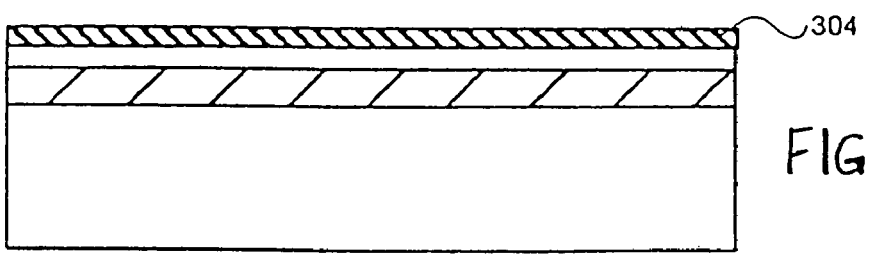

Then, annealing is performed in an NH$_3$ environment immediately after performing the above step to introduce nitrogen atoms of approximately $6 \times 10^{20}$ atoms/cm$^3$ into the silicon oxide film 304. Thereafter, wet oxidation is performed in an environment at a temperature of 825° C. to reduce the hydrogen atomic concentration in the silicon oxide film 304 to $5 \times 10^{20}$ atoms/cm$^3$ or less. FIG. 18(c) shows the process up to this step.

Figure 19A:
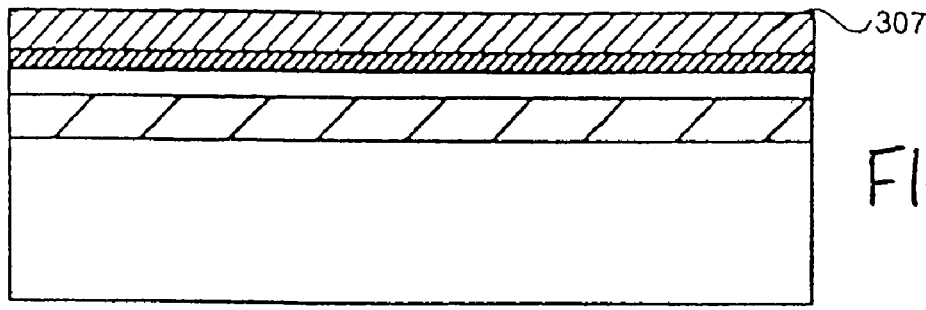
FIGS. 19(a) to 19(d) are cross-sectional views for explaining a method for fabricating the semiconductor device in FIGS. 18(a) to 18(c)

Then, a polycrystalline silicon film 307 doped with p-type impurities (e.g. boron) is formed on the silicon oxide film 304. FIG. 19(a) shows the process up to this step.

Figure 19B:
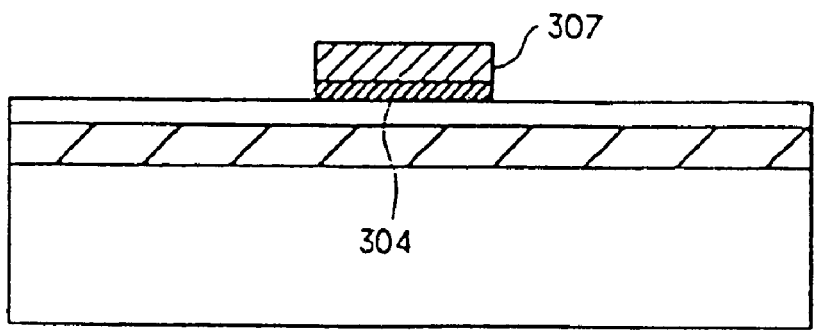
Figure 19C:
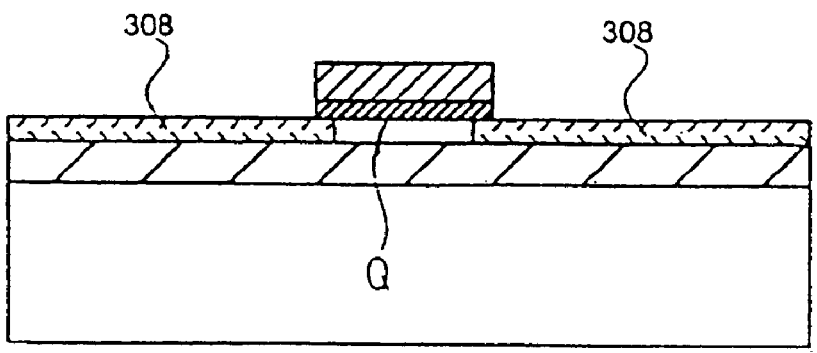

Then the polycrystalline silicon film 307 is patterned to form a gate electrode made of the polycrystalline silicon film 307. The patterning is performed by photolithography and dry etching techniques. FIG. 19(b) shows the process up to this step.

Then, the polycrystalline silicon film 303 is doped with p-type impurities (e.g. boron) by the ion implantation method by using the gate electrode 307 as an impurity doping mask to form a pair of p-type semiconductor regions 308 serving as source and drain regions. In this step, an MOS transistor Q is formed. See FIG. 19(c).

Then, an interlayer dielectric film 309 is formed on the entire surface of the n-type semiconductor substrate 301 including the surface of the gate electrode 307, and thereafter, contact holes reaching the pair of p-type semiconductor regions 308 are formed through the interlayer dielectric film 309.

Figure 19D:
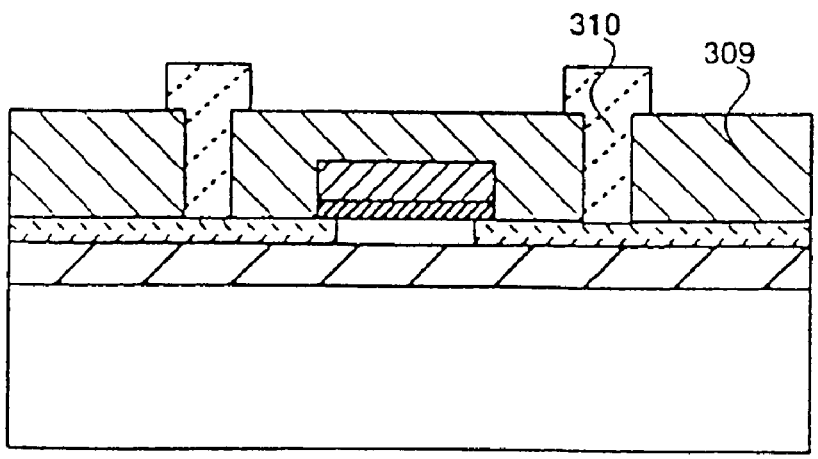

Then, a metallic film is formed on the entire surface of the interlayer dielectric film including the inside of the contact holes, and thereafter, the metallic film is patterned to form a wiring 310. Thereby, the state shown in FIG. 19(d) is obtained.

The standby current of the MOS transistor is reduced compared to a case of using a silicon oxide film formed by the CVD process or a silicon oxide film formed by thermally oxidizing the polycrystalline silicon film 303. Moreover, the on-current is increased. As a result, a high on/off ratio is obtained.

In the case of this embodiment, the nitrogen atomic concentration in the silicon oxide film 304 is set to $6 \times 10^{20}$ atoms/cm$^3$. However, by keeping the concentration in a range between approximately $2 \times 10^{20}$ atoms/cm$^3$ or more and preferably $2 \times 10^{21}$ atoms/cm$^3$ or less, a high on/off ratio is also obtained.

This embodiment has an advantage that the on/off ratio of an MOS transistor can be improved by using a silicon oxide film containing nitrogen atoms in a range between approximately $2 \times 10^{20}$ atoms/cm$^3$ or more and $2 \times 10^{21}$ atoms/cm$^3$ or less as the gate dielectric film of an MOS transistor using a polycrystalline silicon film as an active layer.

In the case of this embodiment, a p-channel conducting-type MOS transistor Q is described. However, the same advantage can be also obtained from an n-channel conducting-type MOS transistor.

Moreover, in the case of this embodiment, an MOS transistor using a polycrystalline silicon film as an active layer is formed by forming a silicon oxide film on a semiconductor substrate. However, the same advantage can be obtained by forming a polycrystalline silicon film on a glass substrate like a liquid-crystal-display driving MOS transistor (without a silicon single-crystal substrate).

Furthermore, in the case of this embodiment, an MOS transistor using a bottom polycrystalline silicon film as an active layer and a top polycrystalline silicon layer as a gate electrode is described. However, the same advantage can be also obtained from an MOS transistor using a bottom polycrystalline silicon film as a gate electrode and a top polycrystalline silicon film as an active layer.

In the case of the above embodiments 1 to 5, annealing is performed in an $NH_3$ environment when introducing nitrogen atoms into a silicon oxide film. However, it is also possible to use other gases containing nitrogen. For example, (and not to be limiting), the annealing can be performed in environments containing at least one of $N_2O$, NO and $NO_2$, either in addition to or instead of $NH_3$. Differing rates and amounts of incorporation of nitrogen occur with use of different gas environments; for example, $N_2O$ and NO only have a small effect. Moreover, annealing temperatures, to incorporate nitrogen in the silicon oxide film, varies; for example, annealing in an $N_2O$ environment should be performed at temperatures greater than 900° C., and in an NO environment (at 1 atmosphere pressure) the annealing temperature should be, e.g., around 850° C.

Use of $NH_3$ has the advantage that the annealing to incorporate nitrogen in the silicon oxide film according to the present invention can be performed at relatively low temperatures (e.g., where the pressure is around one atmosphere, the annealing can be performed at around 700° C). Accordingly, diffusion (enlargement) of active (impurity) regions, and degrading of the tunnel oxide, can be avoided. While use of an $NH_3$ environment will also incorporate hydrogen in the silicon oxide film during the annealing, the concentration of hydrogen in the silicon oxide can be reduced thereafter by the wet oxidation described previously.

Moreover, it is possible to introduce nitrogen atoms simultaneously with deposition of a silicon oxide film. Furthermore, it is possible to use any other method as long as the advantages of the present invention can be obtained.

Moreover, the above embodiments 1 to 5 are described by using a polycrystalline silicon film. However, the same advantage can be obtained from an amorphous silicon film.

The invention made by the present inventors is specifically described above in accordance with the above embodiments. However, the present invention is not restricted to the embodiments. It is a matter of course that various modifications can be made as long as they are not deviated from the gist of the present invention.

For example, the present invention can be applied to a semiconductor device having a capacitor using a bottom polycrystalline silicon film or an amorphous silicon film as a bottom electrode, a top polycrystalline silicon film or an amorphous silicon film as a top electrode, and a silicon oxide film (having nitrogen incorporated therein according to the present invention) between these electrodes as a dielectric film. In this case, the retention capability of the capacitor can be improved.

Moreover, the present invention can be applied to a one-chip microcomputer (semiconductor device) provided with a memory cell array having a nonvolatile memory device.

Advantages obtained from typical one of the inventions disclosed in this application are briefly described below.

It is possible to improve the retention capability of a nonvolatile memory device to be mounted on a semiconductor device.

Moreover, it is possible to stably operate even a scaled nonvolatile memory device.

Furthermore, it is possible to reduce the programming voltage of a nonvolatile memory device.

Furthermore, it is possible to improve the performances of an MOS transistor to be mounted on a semiconductor device.

Furthermore, it is possible to improve the retention capability of a capacitor to be mounted on a semiconductor device.

While we have shown and described several embodiments in accordance with the present invention, it is understood that the same is not limited thereto, but is susceptible to numerous changes and modifications as known to one having ordinary skill in the art, and we therefore do not wish to be limited to the details shown and described herein, but intend to cover all such modifications as are encompassed by the scope of the appended claims.

What is claimed is:

1. A semiconductor device comprising:
    a plurality of non-volatile memory elements, each of the plurality of non-volatile memory elements including:
    a first silicon oxide film formed on a silicon substrate,
    a first silicon film formed on the first silicon oxide film and being a floating gate,
    a second silicon oxide film formed on the first silicon film, and
    a second silicon film formed on the second silicon oxide film and being a control gate,
    wherein a nitrogen atomic concentration in a center portion of the second silicon oxide film, in a thickness direction thereof is not less than $2 \times 10^{20}$ atoms/cm$^3$.

2. A semiconductor device according to claim 1, wherein the nitrogen atomic concentration in the center portion of the second silicon oxide film is not more than $2 \times 10^{21}$ atoms/cm$^3$.

3. A semiconductor device according to claim 1, wherein the nitrogen atomic concentration in an upper portion of the second silicon film, in the thickness direction, is lower than that in the center portion of the second silicon oxide film, and wherein a nitrogen atomic concentration in a lower portion of the second silicon oxide film, in the thickness direction, is larger than that in the center portion of the second silicon oxide film.

4. A semiconductor device according to claim 1, wherein a nitrogen atomic concentration in a lower portion of the second silicon film, in the thickness direction, is larger than that in an upper portion of the second silicon oxide film, in the thickness direction.

5. A semiconductor device according to claim 1, wherein the hydrogen atomic concentration in the second silicon oxide film is not more than $5 \times 10^{20}$.

6. A semiconductor device according to claim 1, wherein each of the first and second silicon films includes n-type impurities.

* * * * *